US009076516B2

(12) United States Patent
Nam et al.

(10) Patent No.: US 9,076,516 B2
(45) Date of Patent: Jul. 7, 2015

(54) METHOD FOR PROGRAMMING A NONVOLATILE MEMORY DEVICE

(71) Applicants: Sang-Wan Nam, Hwaseong-si (KR); Junghoon Park, Hwaseong-si (KR)

(72) Inventors: Sang-Wan Nam, Hwaseong-si (KR); Junghoon Park, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 356 days.

(21) Appl. No.: 13/661,021

(22) Filed: Oct. 25, 2012

(65) Prior Publication Data

US 2013/0250677 A1 Sep. 26, 2013

(30) Foreign Application Priority Data

Mar. 23, 2012 (KR) ........................ 10-2012-0029738

(51) Int. Cl.
*G11C 16/04* (2006.01)
*G11C 13/00* (2006.01)
*G11C 16/10* (2006.01)
*G11C 11/56* (2006.01)
*G11C 16/34* (2006.01)

(52) U.S. Cl.
CPC ............ *G11C 13/0002* (2013.01); *G11C 16/10* (2013.01); *G11C 11/5628* (2013.01); *G11C 16/0483* (2013.01); *G11C 16/3418* (2013.01); *G11C 2213/71* (2013.01); *G11C 2211/5648* (2013.01)

(58) Field of Classification Search
USPC ............. 365/185.01, 185.03, 185.14, 185.18, 365/185.33, 233.1
See application file for complete search history.

(56) References Cited

U.S. PATENT DOCUMENTS 7,493,457 B2 * 2/2009 Murin ........................... 711/157
7,680,977 B2 3/2010 Luo et al.
7,684,256 B2 3/2010 Kim
2010/0322000 A1 12/2010 Shim et al.
2011/0145487 A1 6/2011 Haratsch et al.
2011/0205805 A1 * 8/2011 Honma et al. ........... 365/185.22

FOREIGN PATENT DOCUMENTS

JP 2010-198252 9/2010
KR 1020080030253 A 4/2008
KR 1020100095938 A 9/2010
KR 1020100136785 A 12/2010
KR 1020110001701 A 1/2011

* cited by examiner

*Primary Examiner* — Thao H Bui
(74) *Attorney, Agent, or Firm* — Renaissance IP Law Group LLP

(57) ABSTRACT

Provided is a method for programming a nonvolatile memory device, which includes memory cells arranged in a plurality of rows. The programming method includes alternately selecting word lines to program data at a first page portion and a second page portion associated with the memory cells. After the first and second page portions are programmed, the method includes programming data at a third page portion associated with the memory cells according to an order in which word lines are arranged. The word lines may be sequentially selected one by one from a word line adjacent to a ground selection line.

19 Claims, 35 Drawing Sheets

<FA_PGM Block>

Fig. 6A

<PA_PGM Block>

| Page / WL | 1st Page | 2nd Page | 3rd Page |
|---|---|---|---|
| WL<15> | 29 | 31 | |
| WL<14> | 27 | 30 | |
| WL<13> | 25 | 28 | |
| WL<12> | 23 | 26 | |
| WL<11> | 21 | 24 | |
| WL<10> | 19 | 22 | |
| WL<9> | 17 | 20 | |
| WL<8> | 15 | 18 | |
| WL<7> | 13 | 16 | |
| WL<6> | 11 | 14 | 38 |
| WL<5> | 9 | 12 | 37 |
| WL<4> | 7 | 10 | 36 |
| WL<3> | 5 | 8 | 35 |
| WL<2> | 3 | 6 | 34 |
| WL<1> | 1 | 4 | 33 |
| WL<0> | 0 | 2 | 32 |

WL<15>–WL<7>: Partially Programmed (9-WL)

WL<6>–WL<0>: Fully Programmed

Fig. 6B

<FA_PGM Block>

| WL \ Page | 1st Page | 2nd Page | 3rd Page |
|---|---|---|---|
| WL<15> | | | |
| WL<14> | | | |
| WL<13> | 36 | | |
| WL<12> | 33 | 37 | |
| WL<11> | 30 | 34 | 38 |
| WL<10> | 27 | 31 | 35 |
| WL<9> | 24 | 28 | 32 |
| WL<8> | 21 | 25 | 29 |
| WL<7> | 18 | 22 | 26 |
| WL<6> | 15 | 19 | 23 |
| WL<5> | 12 | 16 | 20 |
| WL<4> | 9 | 13 | 17 |
| WL<3> | 6 | 10 | 14 |
| WL<2> | 3 | 7 | 11 |
| WL<1> | 1 | 4 | 8 |
| WL<0> | 0 | 2 | 5 |

Partially Programmed

Fully Programmed

Fig. 7

Fully Programmed (WL 0–6) | Partially Programmed (WL 7–15)

<BLK1>

| WL | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 1st Page | 0 | 1 | 3 | 5 | 7 | 9 | 11 | 13 | 15 | 17 | 19 | 21 | 23 | 25 | 27 | 29 |
| 2nd Page | 2 | 4 | 6 | 8 | 10 | 12 | 14 | 16 | 18 | 20 | 22 | 24 | 26 | 28 | 30 | 31 |
| 3rd Page | 32 | 33 | 34 | 35 | 36 | 37 | 38 | | | | | | | | | |

<BLK2>

| WL | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 1st Page | 0 | 1 | 3 | 5 | 7 | 9 | 11 | 13 | 15 | 17 | 19 | 21 | 23 | 25 | 27 | 29 |
| 2nd Page | 2 | 4 | 6 | 8 | 10 | 12 | 14 | 16 | 18 | 20 | 22 | 24 | 26 | 28 | 30 | 31 |
| 3rd Page | 32 | 33 | 34 | 35 | 36 | 37 | 38 | | | | | | | | | |

<BLK3>

| WL | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 1st Page | 0 | 1 | 3 | 5 | 7 | 9 | 11 | 13 | 15 | 17 | 19 | 21 | 23 | 25 | 27 | 29 |
| 2nd Page | 2 | 4 | 6 | 8 | 10 | 12 | 14 | 16 | 18 | 20 | 22 | 24 | 26 | 28 | 30 | 31 |
| 3rd Page | 32 | 33 | 34 | 35 | 36 | 37 | 38 | | | | | | | | | |

Fig. 9

Fully Programmed (WL 0–6); Partially Programmed (WL 7–15)

| WL | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 1st Page | 0 | 1 | 3 | 5 | 7 | 9 | 11 | 13 | 15 | 17 | 19 | 21 | 23 | 25 | 27 | 29 |
| 2nd Page | 2 | 4 | 6 | 8 | 10 | 12 | 14 | 16 | 18 | 20 | 22 | 24 | 26 | 28 | 30 | 31 |
| 3rd Page | 32 | 33 | 34 | 35 | 36 | 37 | 38 | | | | | | | | | |

Alternate Sequence (1st Page, 2nd Page)

Sequential Sequence (3rd Page)

Fig. 11A

<P_Mode=FA_PGM>

Partially Programmed

| WL | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 1st Page | 0 | 1 | 3 | 6 | 9 | 12 | 15 | 18 | 21 | 24 | 27 | 30 | 33 | 36 | | |
| 2nd Page | 2 | 4 | 7 | 10 | 13 | 16 | 19 | 22 | 25 | 28 | 31 | 34 | 37 | | | |
| 3rd Page | 5 | 8 | 11 | 14 | 17 | 20 | 23 | 26 | 29 | 32 | 35 | 38 | | | | |

Fig. 11B

<P_Mode=PA_PGM>

Partially Programmed

| WL | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 1st Page | 0 | 1 | 3 | 5 | 7 | 9 | 11 | 13 | 15 | 17 | 19 | 21 | 23 | 25 | 27 | 29 |
| 2nd Page | 2 | 4 | 6 | 8 | 10 | 12 | 14 | 16 | 18 | 20 | 22 | 24 | 26 | 28 | 30 | 31 |
| 3rd Page | 32 | 33 | 34 | 35 | 36 | 37 | 38 | | | | | | | | | |

Fig. 14

FA_PGM

<BLK0>

| WL | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 1st Page | 0 | 1 | 3 | 6 | 9 | 12 | 15 | 18 | 21 | 24 | 27 | 30 | 33 | 36 | 39 | 42 |
| 2nd Page | 2 | 4 | 7 | 10 | 13 | 16 | 19 | 22 | 25 | 28 | 31 | 34 | 37 | 40 | 43 | 45 |
| 3rd Page | 5 | 8 | 11 | 14 | 17 | 20 | 23 | 16 | 29 | 32 | 35 | 38 | 41 | 44 | 46 | 47 |

<BLK1>

| WL | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 1st Page | 0 | 1 | 3 | 6 | 9 | 12 | 15 | 18 | 21 | 24 | 27 | 30 | 33 | 36 | 39 | 42 |
| 2nd Page | 2 | 4 | 7 | 10 | 13 | 16 | 19 | 22 | 25 | 28 | 31 | 34 | 37 | 40 | 43 | 45 |
| 3rd Page | 5 | 8 | 11 | 14 | 17 | 20 | 23 | 16 | 29 | 32 | 35 | 38 | 41 | 44 | 46 | 47 |

<BLK2>

| WL | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 1st Page | 0 | 1 | 3 | 6 | 9 | 12 | 15 | 18 | 21 | 24 | 27 | 30 | 33 | 36 | 39 | 42 |
| 2nd Page | 2 | 4 | 7 | 10 | 13 | 16 | 19 | 22 | 25 | 28 | 31 | 34 | 37 | 40 | 43 | 45 |
| 3rd Page | 5 | 8 | 11 | 14 | 17 | 20 | 23 | 16 | 29 | 32 | 35 | 38 | 41 | 44 | 46 | 47 |

PA_PGM

<BLK3>

| WL | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 1st Page | 0 | 1 | 3 | 5 | 7 | 9 | 11 | 13 | 15 | 17 | 19 | 21 | 23 | 25 | 27 | 29 |
| 2nd Page | 2 | 4 | 6 | 8 | 10 | 12 | 14 | 16 | 18 | 20 | 22 | 24 | 26 | 28 | 30 | 31 |
| 3rd Page | 32 | 33 | | | | | | | | | | | | | | |

Fig. 20

<NVM Chip_i>

| WL | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 1st Page | 0 → | 1 | 3 | 5 | 7 | 9 | 11 | 13 | 15 | 17 | 19 | 21 | 23 | 25 | 27 | 29 |
| 2nd Page | 2 | 4 | 6 | 8 | 10 | 12 | 14 | 16 | 18 | 20 | 22 | 24 | 26 | 28 | 30 | 31 |
| 3rd Page | 32 → | 33 → | 34 → | 35 → | 36 → | 37 → | 38 | | | | | | | | | |

Fig. 24A

| WL \ Page | 1st Page | 2nd Page | 3rd Page |
|---|---|---|---|
| WL<15> | 30 | 31 | |
| WL<14> | 28 | 29 | |
| WL<13> | 26 | 27 | |
| WL<12> | 24 | 25 | |
| WL<11> | 22 | 23 | |
| WL<10> | 20 | 21 | |
| WL<9> | 18 | 19 | |
| WL<8> | 16 | 17 | |
| WL<7> | 14 | 15 | |
| WL<6> | 12 | 13 | 38 |
| WL<5> | 10 | 11 | 37 |
| WL<4> | 8 | 9 | 36 |
| WL<3> | 6 | 7 | 35 |
| WL<2> | 4 | 5 | 34 |
| WL<1> | 2 | 3 | 33 |
| WL<0> | 0 | 1 | 32 |

2-bit PGM    Sequential PGM

METHOD FOR PROGRAMMING A NONVOLATILE MEMORY DEVICE

CROSS-REFERENCE TO RELATED APPLICATIONS

A claim for priority under 35 U.S.C. §119 is made to Korean Patent Application No. 10-2012-0029738 filed Match 23, 2012, in the Korean Intellectual Property Office, the entire contents of which are hereby incorporated by reference.

BACKGROUND

The inventive concepts described herein relate to a semiconductor memory device, and more particularly, relate to a nonvolatile memory device, a nonvolatile memory system, and a programming method thereof.

Semiconductor memory devices may be volatile and nonvolatile. The volatile semiconductor memory devices may perform read and write operations at high speed, while contents stored therein may be lost at power-off. The nonvolatile semiconductor memory devices may retain contents stored therein even at power-off. The nonvolatile semiconductor memory devices may be used to store contents which must be retained regardless of whether they are powered.

The nonvolatile semiconductor memory devices may include a mask read-only memory (MROM), a programmable ROM (PROM), an erasable programmable ROM (EPROM), an electrically erasable programmable ROM (EEPROM), and the like.

A flash memory device may represent a nonvolatile semiconductor memory device. The flash memory device may be widely used as a voice and image data storing medium for information appliances such as a computer, a cellular phone, a PDA, a digital camera, a camcorder, a voice recorder, an MP3 player, a handheld PC, a game machine, a facsimile, a scanner, a printer, and the like.

In recent years, a semiconductor memory device having memory cells stacked in three dimensions have been researched to improve the integrity of the semiconductor memory device.

SUMMARY

Example embodiments of the inventive concept provide a method for programming a nonvolatile memory device, the nonvolatile device including multi-level cells programmed by a unit of a plurality of page portions. The programming method comprises selecting a memory unit such as a memory block, a sub-block, and a super block of the nonvolatile memory device, and programming at least two page portions including an LSB page portion in the memory unit according to an alternate programming manner in which rows are alternately selected.

Example embodiments of the inventive concept also provide a method of programming write data at a nonvolatile memory device, which includes multi-level memory cells. The method comprises programming a part of the write data at a first page portion and a second page portion of a selected memory unit according to an alternate programming manner in which rows are alternately selected, and programming the rest of the write data at a third page portion of the memory unit according to a sequential programming manner in which the rows are sequentially selected.

Example embodiments of the inventive concept also provide method of programming write data at a nonvolatile memory device, which includes multi-level memory cells.

The method comprises programming a part of the write data at a first page portion, a second page portion, and a third page portion of a selected memory unit according to an alternate programming manner in which rows are alternately selected, and programming the rest of the write data at a fourth page portion of the memory unit according to a sequential programming manner in which the rows are sequentially selected.

Example embodiments of the inventive concept also provide a nonvolatile memory device, which comprises a memory cell array including multi-level memory cells to be programmed by a unit of a plurality of pages, a page buffer connected to bit lines of the memory cell array, a row decoder connected to the memory cell arrays via word lines and selection lines, and control logic configured to control the page buffer or the row decoder to program data at a plurality of page portions included in a selected memory unit. When write data is smaller than a storage capacity of the selected memory unit, a part of the write data is programmed at the remaining page portions of the plurality of page portions other than at least one page portion.

Example embodiments of the inventive concept also provide a memory system, which comprises a nonvolatile memory device including multi-level memory cells programmed by a unit of a plurality of page portions, and a memory controller configured to select a memory unit of the nonvolatile memory device to program write data. The memory controller is configured to control the nonvolatile memory device to program the write data according to one of a partial alternate programming mode, wherein some page portions of the memory unit are programmed according to an alternate programming manner in which rows are alternately selected, and according to a full alternate programming manner in which all page portions of the memory unit are programmed according to the alternate programming manner.

Example embodiments of the inventive concept also provide a method for programming a nonvolatile memory device, which includes memory cells arranged in a plurality of rows. The programming method comprises alternately selecting word lines to program data at a first page portion and a second page portion associated with the memory cells, and after the first and second page portions are filled, programming data at a third page portion associated with the memory cells according to an order in which word lines are arranged.

Example embodiments of the inventive concept also provide a method for programming a nonvolatile memory device, which includes memory cells arranged in a plurality of rows. The programming method comprises programming data at a first page portion associated with the memory cells according to an order in which word lines are arranged, and after the first page portion is filled, alternately selecting the word lines to program data at a second page portion and a third page portion associated with the memory cells.

Example embodiments of the inventive concept also provide a method for programming a nonvolatile memory device, which includes a plurality of rows each having a plurality of page portions in which data is written by a page unit. The programming method comprises selecting at least two page portions of the page portions of each row in a first scramble manner to program the at least two page portions, and programming another one of the page portions of each row in a second scramble manner in which the plurality of rows are sequentially selected according to an arrangement order.

Example embodiments of the inventive concept also provide a nonvolatile memory device, which comprises a memory cell array including multi-level cells to be programmed by a page unit, a page buffer connected to bit lines of the memory cell array, a row decoder connected to the memory cell arrays via word lines and selection lines, and control logic configured to control the page buffer or the row decoder to program data at a plurality of page portions included in a selected memory unit. When write data is smaller than a storage capacity of the selected memory unit, the control logic is configured to control the page buffer or the row decoder to program at least two page portions of page portions of each of the plurality of rows in a first scramble manner and at least another page portion of the page portions in a second scramble manner in which rows are selected according to an arrangement order.

Example embodiments of the inventive concept also provide a memory system comprising a nonvolatile memory device configured to program write data according to a partial alternate programming mode, wherein some page portions of a selected memory block are programmed according to an alternate programming manner in which rows are alternately selected, and a full alternate programming manner in which all page portions of the selected memory block are programmed according to the alternate programming manner. The memory system may include a memory controller configured to control the nonvolatile memory device in response to an attribute such that the write data is programmed in one of the partial alternate programming mode and the full alternate programming mode.

Example embodiments of the inventive concept also provide a memory system comprising a nonvolatile memory device configured to program write data according to a partial alternate programming mode, wherein some page portions of a selected memory block are programmed according to an alternate programming manner in which rows are alternately selected, and a full alternate programming manner in which all page portions of the selected memory block are programmed according to the alternate programming manner. The memory system may include a memory controller configured to control the nonvolatile memory device in response to a power management mode such that the write data is programmed in one of the partial alternate programming mode and the full alternate programming mode.

Example embodiments of the inventive concept also provide a method for programming a nonvolatile memory device, which includes multi-level memory cells programmed by a page unit. The programming method comprises programming data in at least two page portions of a selected memory unit in an alternate programming manner in which rows are alternately selected, and programming data in at least another page portion of the selected memory unit in a sequential programming manner in which the rows are selected according to an arrangement order.

Example embodiments of the inventive concept also provide a programming method of a nonvolatile memory device, which includes multi-level memory cells connected to a first word line, a second word line adjacent to the first word line, and a third word line adjacent to the second word line. The programming method comprises programming data at a second page portion of memory cells connected to the first word line, programming data at a first page portion of memory cells connected to the third word line, programming data at a second page portion of memory cells connected to the second word line, programming data at a third page portion of memory cells connected to the first word line, programming data at a third page portion of memory cells connected to the second word line, and programming data at a third page portion of memory cells connected to the third word line.

Example embodiments of the inventive concept also provide a method for programming a nonvolatile memory device, which includes memory cells arranged in a plurality of rows. The programming method includes alternately selecting word lines to program data at a first page portion and a second page portion associated with the memory cells, and after the first and second page portions are programmed, programming data at a third page portion associated with the memory cells according to an order in which word lines are arranged. The word lines may be sequentially selected one by one from a word line adjacent to a ground selection line.

Example embodiments of the inventive concept also provide a method for programming a nonvolatile memory device, which includes memory cells arranged in a plurality of rows. The programming method comprises programming data at a first page portion associated with the memory cells according to an order in which word lines are arranged, and after the first page portion is programmed, alternately selecting the word lines to program data at a second page portion and a third page portion associated with the memory cells. The word lines may be sequentially selected one by one from a word line adjacent to a ground selection line.

Example embodiments of the inventive concept also provide a method for programming a nonvolatile memory device, which includes memory cells arranged in a plurality of rows, a plurality of page portions being assigned to memory cells corresponding to each of the plurality of rows. The programming method comprises selecting at least two page portions of the page portions associated with the memory cells in a first scramble manner to program the at least two page portions, and programming another one of the page portions associated with the memory cells in a second scramble manner in which the plurality of rows are sequentially selected according to an arrangement order.

BRIEF DESCRIPTION OF THE FIGURES

The above and other advantages and features will become apparent from the following description with reference to the following figures, wherein like reference numerals refer to like parts throughout the various figures unless otherwise specified, and wherein

FIGS. 6A and 6B are tables illustrating a programming method according to an embodiment of the inventive concept.

FIG. 7 is a table illustrating a method for programming a vertical nonvolatile memory device according to an embodiment of the inventive concept.

FIG. 9 is a table illustrating a data writing method applied to a memory block having planar cell strings.

FIGS. 11A and 11B are tables illustrating a full alternate programming method and a partial alternate programming method, respectively, of a nonvolatile memory device in FIG. 10.

FIG. 14 shows tables illustrating a programming method of a memory system in FIG. 13.

FIG. 20 is a table illustrating a partial alternate programming method of a nonvolatile memory chip in FIG. 19.

FIGS. 24A to 24C are diagrams illustrating programming methods according to still other embodiments of the inventive concept.

DETAILED DESCRIPTION

Figure 1:
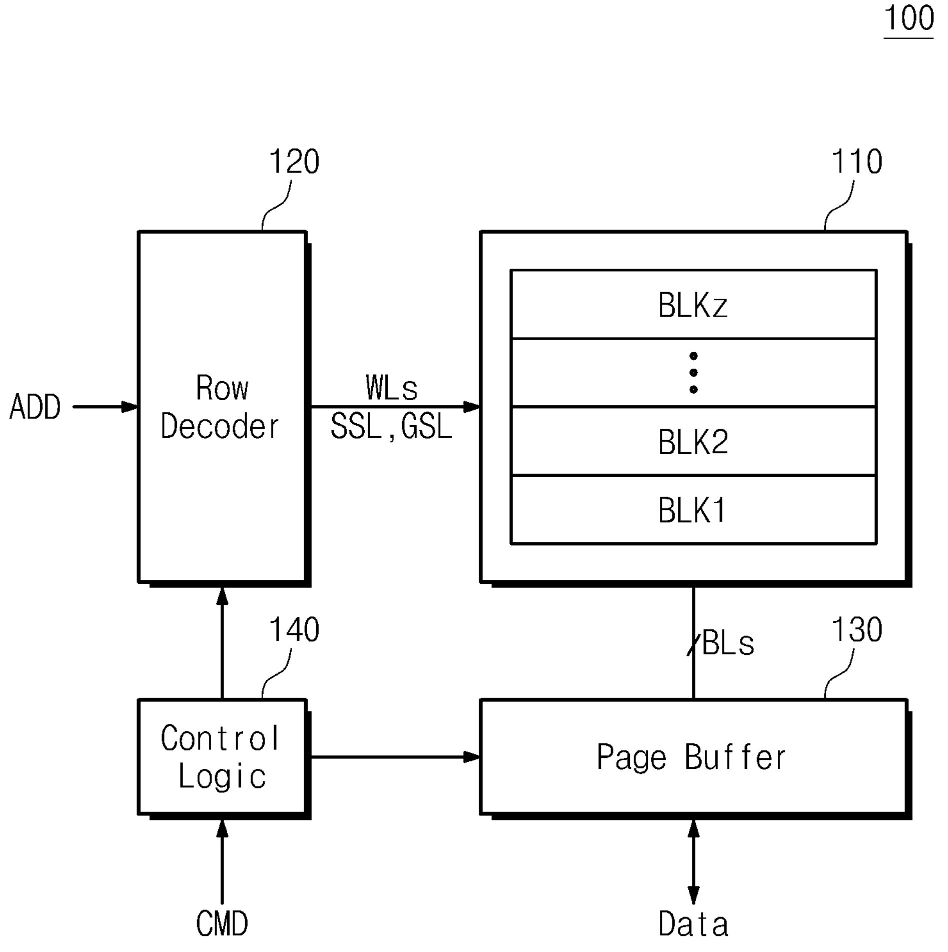
FIG. 1 is a block diagram schematically illustrating a nonvolatile memory device according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms “first”, “second”, “third”, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as “beneath”, “below”, “lower”, “under”, “above”, “upper” and the like, may be used herein for ease of description to describe one element or feature’s relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as “below” or “beneath” or “under” other elements or features would then be oriented “above” the other elements or features. Thus, the exemplary terms “below” and “under” can encompass both an orientation of above and below. The device may be otherwise oriented (rotated 90 degrees or at other orientations) and the spatially relative descriptors used herein interpreted accordingly. In addition, it will also be understood that when a layer is referred to as being “between” two layers, it can be the only layer between the two layers, or one or more intervening layers may also be present.

The terminology used herein is for the purpose of describing particular embodiments only and is not intended to be limiting of the inventive concept. As used herein, the singular forms “a”, “an” and “the” are intended to include the plural forms as well, unless the context clearly indicates otherwise. It will be further understood that the terms “comprises” and/or “comprising,” when used in this specification, specify the presence of stated features, integers, steps, operations, elements, and/or components, but do not preclude the presence or addition of one or more other features, integers, steps, operations, elements, components, and/or groups thereof. As used herein, the term “and/or” includes any and all combinations of one or more of the associated listed items. Also, the term “exemplary” is intended to refer to an example or illustration.

It will be understood that when an element or layer is referred to as being “on”, “connected to”, “coupled to”, or “adjacent to” another element or layer, it can be directly on, connected, coupled, or adjacent to the other element or layer, or intervening elements or layers may be present. In contrast, when an element is referred to as being “directly on,” “directly connected to”, “directly coupled to”, or “immediately adjacent to” another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

In addition, the terms "a first page portion", "a second page portion", and "a third page portion" may be used to indicate a program portion of a memory space formed of multi-level cells. The page portions may be logically divided portions of a selected memory area in the memory space. For example, a word line with multi-level cells can be considered to have multiple pages according to the number of bits that a multi-level cell in the word line can store. The first page portion of a word line may correspond to an LSB (Least Significant Bit) page portion of the word line. On the other hand, the first page portions of a memory block may correspond to first pages of word lines in the memory block, which has a plurality of multi-level cells in the word lines.

FIG. 1 is a block diagram schematically illustrating a nonvolatile memory device according to an embodiment of the inventive concept. Referring to FIG. 1, a nonvolatile memory device 100 may include a memory cell array 110, a row decoder 120, a page buffer 130, and control logic 140.

The memory cell array 110 may be connected to the row decoder 120 via word lines or selection lines SSL and GSL. The memory cell array 110 may be connected to the page buffer 130 via bit lines BLs. The memory cell array 110 may include a plurality of NAND cell strings, which constitute a memory block, a sub block, a super block, and the like according to an operation or selection unit.

Each NAND cell string may have a channel formed in a vertical or horizontal direction. The plurality of memory blocks BLK1 to BLKz may be formed of cell strings formed in a horizontal direction. The word lines of the memory cell array 110 may be stacked in a vertical direction, and channels of the NAND cell strings may be formed in a vertical direction. A memory device in which the memory cell array 110 is formed to have the above-described string structure may be referred to as a vertical nonvolatile memory device or a three-dimensional nonvolatile memory device. However, the inventive concept may be applied to a nonvolatile memory device in which memory blocks each having cell strings formed in a planar direction are stacked on a substrate.

In a memory device in which cell strings are formed in a horizontal direction or in a vertical direction, each of the memory cells may be driven as a multi-level cell (MLC). The multi-level cell may be a memory cell that stores at least two data bits. At MLC programming, word lines may be selected non-sequentially or in turn to reduce the program disturbance. For example, in a shadow programming manner, rows or word lines are selected in turn. With the shadow programming manner, programming schemes in which at least one lower bit (LSB) of at least one upper word line is programmed before at least one upper bit (MSB) of at least one lower word line are collectively referred to herein as shadow programming. An example of shadow programming of the NAND flash memory block is described in U.S. Patent Application Publication No. 2012/0170365 incorporated herein by reference. Below, a programming manner such as the shadow programming manner may be referred to as an alternate programming manner.

However, with the alternate programming manner such as the shadow programming manner, although a memory block is not fully filled, the chance that memory cells are programmed to the uppermost state may be high. With a partial alternate programming manner of the inventive concept, such a ratio that memory cells are programmed to the uppermost state may be reduced. Thus, the nonvolatile memory device 100 of the inventive concept may reduce a principle factor of the program disturbance: how frequently memory cells are programmed to the uppermost state.

The row decoder 120 may select any one of memory blocks BLK1 to BLKz of the memory cell array 110 in response to an address ADD. The row decoder 120 may select one or more of the word lines in the selected memory block. The row decoder 120 may provide word lines of the selected memory block with word line voltages. At a program operation, the row decoder 120 may transfer a program voltage Vpgm and a verification voltage Vvfy to a selected word line and a pass voltage Vpass to an unselected word line, respectively. The row decoder 120 may provide selection signals to the selection lines SSL and GSL to select a memory block, a sub block, or the like.

The page buffer 130 may operate as a write driver or a sense amplifier according to a mode of operation. At a program operation, the page buffer 130 may provide a bit line of the cell array 110 with a bit line voltage corresponding to data to be programmed. At a read operation, the page buffer 130 may sense data stored in a selected memory cell via a bit line. The page buffer 130 may latch the sensed data to output it to an external device.

The control logic 140 may control the row decoder 120 and the page buffer 130 in response to a command CMD from an external device. During a programming operation, the control logic 140 may program input data at a selected memory area, based on a partial alternate programming (hereinafter, referred to as PA_PGM) manner according to an embodiment of the inventive concept. For example, it is assumed that each of the memory blocks BLK1 to BLKz of the memory cell array 110 is formed of 3-bit multi-level cells. With this assumption, first, first and second page portions of the selected memory area (or, block) may be programmed in the alternate programming manner. Then, a third page portion of the selected memory area (or, block) may be programmed according to a sequential programming manner instead of the alternate programming manner. That is, some page portions of the selected memory area (or, block) may be programmed according to the alternate programming manner under the control of the control logic 140. In this case, it is possible to remarkably reduce the number of memory cells, being programmed to the uppermost state, from among memory cells of a memory block.

In the inventive concepts, the alternate programming manner may be a predetermined order which is non-sequential. On the other hand, the sequential programming manner may be a predetermined order according to the order of the word lines. The nonvolatile memory device 100 of the inventive concept may be configured to program a selected area/space (e.g., a memory block, a sub block, a super block, etc.) using a partial alternate programming manner. Thus, it is possible to remarkably reduce the number of memory cells, being programmed to the uppermost state, from among memory cells of a selected area/space (e.g., a memory block). As a result, the program disturbance due to a level of a program voltage may be remarkably reduced.

Figure 2:
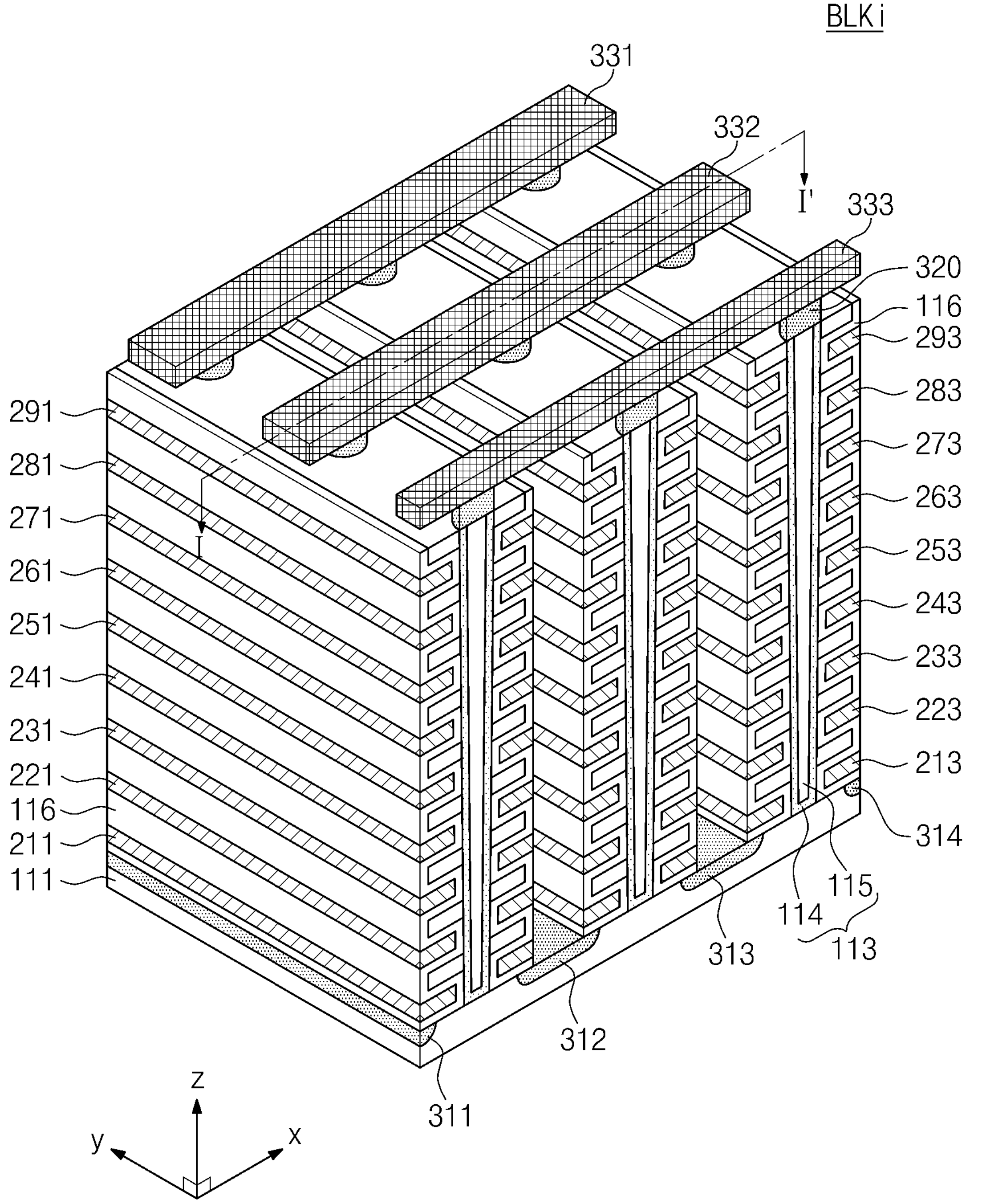
FIG. 2 is a perspective view illustrating one of memory blocks in FIG. 1.
Figure 3:
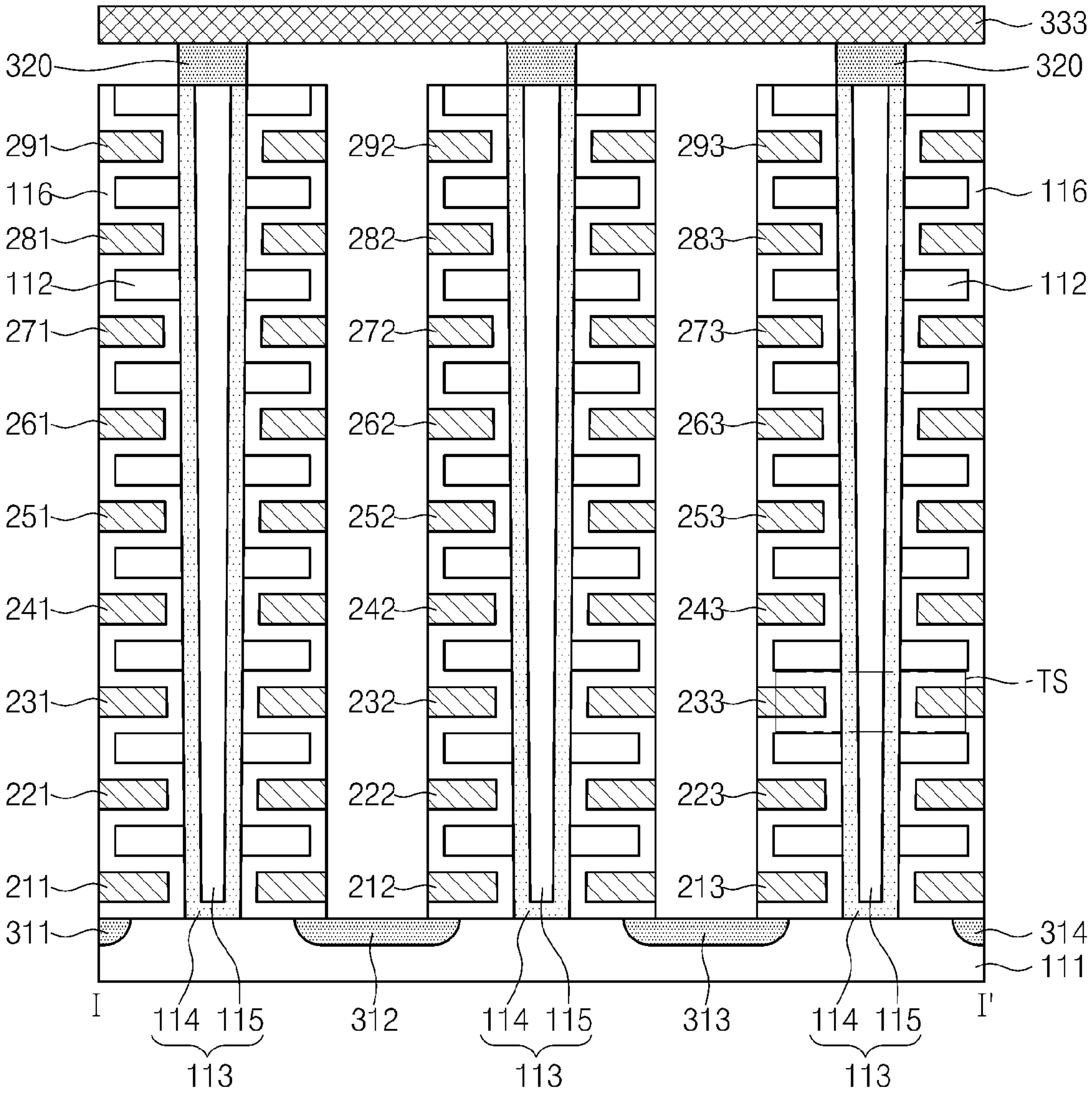
FIG. 3 is a cross-sectional view taken along a line I-I' illustrating a three-dimensional NAND cell string in FIG. 2.

FIG. 2 is a perspective view illustrating one of memory blocks in FIG. 1. FIG. 3 is a cross-sectional view taken along a line I-I' illustrating a three-dimensional NAND cell string in FIG. 2. Referring to FIG. 2, a memory block BLKi may include cell strings formed to have a three-dimensional (3D) or vertical structure. The memory block BLKi may include structures extending along a plurality of directions x, y, and z. Reference is now made to both FIGS. 2 and 3.

A substrate 111 may be provided to form the memory block BLKi. The substrate 111 may be formed of a p-well in which Group V such as boron is injected, for example. Alternatively, the substrate 111 may be a pocket p-well provided within an n-well. Below, it is assumed that the substrate 111 is a p-well. However, the substrate 111 is not limited to a p-well.

A plurality of doping regions 311 to 314 extending along the direction x may be provided in the substrate 111. For example, the plurality of doping regions 311 to 314 may be formed of n-type conductors different from the substrate 111. Below, it is assumed that first to third doping regions 311 to 314 are n-type. However, the first to fourth doping regions 311 to 314 are not limited to the n-type.

On the substrate 111 between the first and second doping regions 311 and 312, a plurality of insulation materials 112 extending along the y-direction may be provided sequentially along the z-direction. The insulation materials 112 may be formed to be spaced apart along the z-direction. For example, the insulation materials 112 may include an insulation material such as silicon oxide.

On the substrate 111 between the first and second doping regions 311 and 312, a plurality of pillars 113 may be arranged sequentially along the y-direction so as to penetrate the plurality of insulation materials 112 along the z-direction. For example, the pillars 113 may contact with the substrate 111 through the insulation materials 112. The pillar 113 may be formed both on the substrate 111 between the second and third doping regions 312 and 313 and on the substrate between third and fourth doping regions 313 and 314.

In example embodiments, each pillar 113 may be formed of a plurality of materials. For example, a surface layer 114 of each pillar 113 may include a first type of a silicon material. For example, the surface layer 114 of each pillar 113 may include a silicon material having the same type as the substrate 111. Below, it is assumed that the surface layer 114 of each pillar 113 includes p-type silicon. However, the surface layer 114 of each pillar 113 is not limited to the p-type silicon.

An inner layer 115 of each pillar 113 may be formed of an insulation material. For example, the inner layer 115 of each pillar 113 may include an insulation material such as silicon oxide. For example, the inner layer 115 of each pillar 113 may include air gap.

An insulation film 116 may be provided between the first and second doping regions 311 and 312 along exposed surfaces of the insulation materials 112, the pillars 113, and the substrate 111. In example embodiments, the insulation film 116 can be removed, which is provided on an exposed surface (toward the z-direction) of the last insulation material 112 provided along the z-direction.

In example embodiments, a thickness of the insulation film 116 may be less than half a distance between the insulation materials 112. That is, an area for disposing another material other than the insulation materials 112 and the insulation film 116 can be provided between an insulation film 116 provided at a lower surface of the first insulation material of the insulation materials 112 and an insulation film 116 provided at an upper surface of the second insulation material placed below the first insulation material.

At a region between the first and second doping regions 311 and 312, first conductive materials 211 to 291 may be provided on an exposed surface of the insulation film 116. For example, the first conductive material 211 extending along the y-direction may be provided between the substrate 111 and an insulation material 112 adjacent to the substrate 111. More specifically, the first conductive material 211 extending in the x-direction may be provided between the substrate 111 and an insulation film 116 of a lower surface of the insulation material 112 adjacent to the substrate 111.

The first conductive material extending along the y-direction may be provided between the insulation film 116 of an upper surface of a specific insulation material of the insulation materials 112 and the insulation film 116 of a lower surface of an insulation material disposed at an upper portion of the specific insulation material. In example embodiments, the first conductive materials 211 to 291 may include a metal material. In example embodiments, the first conductive materials 211 to 291 may include a conductive material such as polysilicon.

The same structure as that on the first and second doping regions 311 and 312 may be provided at an area between the second and third doping regions 312 and 313. For example, at an area between the second and third doping regions 312 and 313, there may be provided a plurality of insulation materials 112 extending in the y-direction, a plurality of pillars 113 disposed sequentially along the y-direction so as to penetrate the insulation materials 113 along the x-direction, an insulation film 116 provided on exposed surfaces of the plurality of pillars 113 and the plurality of insulation materials 112, and a plurality of first conductive materials 212 to 292 extending along the y-direction.

The same structure as that on the first and second doping regions 311 and 312 may be provided at an area between the third and fourth doping regions 313 and 314. For example, at an area between the third and fourth doping regions 313 and 314, there may be provided a plurality of insulation materials 112 extending in the y-direction, a plurality of pillars 113 disposed sequentially along the y-direction so as to penetrate the insulation materials 113 along the z-direction, an insulation film 116 provided on exposed surfaces of the plurality of pillars 113 and the plurality of insulation materials 112, and a plurality of conductive materials 213 to 293 extending along the y-direction.

Drains 320 may be provided on the pillars 113, respectively. The drains 320 may be second-type silicon materials. The drains 320 may be n-type silicon materials. Below, it is assumed that the drains 320 include n-type silicon materials. However, the drains 320 are not limited to include n-type silicon materials. A width of each drain 320 may be wider than that of a corresponding pillar 113. Each drain 320 may be provided on an upper surface of a corresponding pillar 113 in a pad fashion.

Conductive materials 331 to 333 extending along the x-direction may be provided on the drains 320. The conductive materials 331 to 333 may be disposed sequentially along the y-direction. The conductive materials 331 to 333 may be connected with corresponding drains 320, respectively. For example, the drains 320 and the conductive material 333 extending along the x-direction may be connected via contact plugs, respectively. The conductive materials 331 to 333 may be a metallic material. The conductive materials 331 to 333 may be a conductive material such as polysilicon.

Referring to FIG. 3, a cell string may include a plurality of memory cells, which are formed around a pillar connected with a bit line. For ease of description, it is assumed that a cell string includes seven memory cells.

A pillar 113 may be formed between first and second doping regions 311 and 312 to penetrate a plurality of insulation materials 112 along a z-direction. The pillar 113 may contact with a substrate 111 via the insulation materials 112. The pillar 113 may include a channel film 114 and an inner material 115.

The channel film 114 may include a semiconductor material (e.g., silicon) having the first conductive type. For example, the channel film 114 may include a semiconductor material (e.g., silicon) having the same conductive type as the substrate 111. Below, it is assumed that the channel film 114 includes p-type silicon. However, the inventive concept is not limited thereto. For example, the channel film 114 may include intrinsic semiconductor being a non-conductive characteristic.

The inner material 115 may include an insulation material. For example, the inner material 115 may include an insulation material such as silicon oxide. For example, the inner material 115 may include air gap.

Information storage films 116 may be provided on exposed surfaces of the insulation materials 112 and the pillar 113 between the first and second doping regions 311 and 312. Conductive materials (e.g., 211 to 291, 212 to 292, and 213 to 293) may be provided on exposed surfaces of the insulation storage films 116 between adjacent doping regions 311 and 312.

The conductive materials (e.g., 211 to 291, 212 to 292, and 213 to 293) and the insulation materials 112 may be separated by word line cuts on the doping regions 311 and 312. In example embodiments, the conductive materials (e.g., 211 to 291, 212 to 292, and 213 to 293) may include a metallic conductive material. The conductive materials may include a non-metallic conductive material such as polysilicon. An example structure of a 3-demensional NAND cell string and the memory block is described in U.S. Patent Application Publication No. 20100117141, incorporated herein by reference.

A drain 320 may be formed on the pillar 113. In example embodiments, the drain 320 may include a semiconductor material (e.g., silicon) having the second conductive type. For example, the drain 320 may include an n-type semiconductor material (e.g., silicon). Below, it is assumed that the drain 320 includes n-type silicon. However, the inventive concept is not limited thereto. In example embodiments, the drain 320 may be extended toward a top of the channel film 114 of the pillar 113.

A bit line BL in FIG. 3 (e.g., 333) extending in an x-direction in FIG. 2 may be provided on the drain 320. The bit line BL may be connected with the drain 320. In example embodiments, the drain 320 and the bit line BL may be interconnected via a contact plug (not shown). In example embodiments, the bit line BL may include a metallic conductive material. In example embodiments, the bit line BL may include a non-metallic conductive material such as polysilicon.

Figure 4:
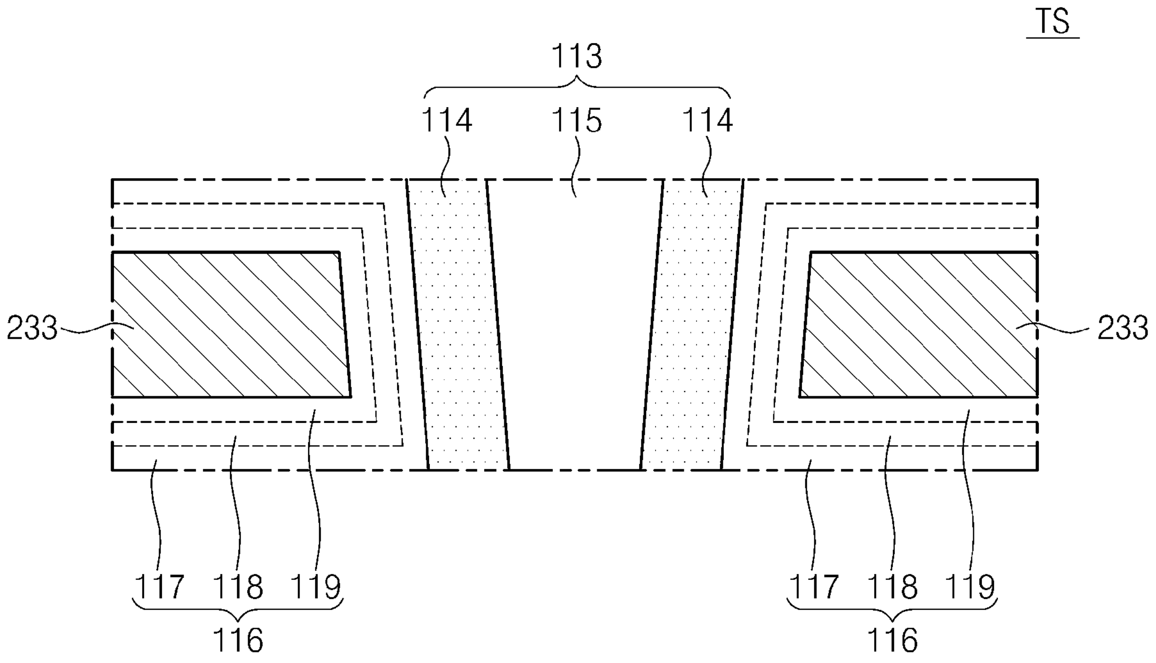
FIG. 4 is a cross-sectional view of a transistor structure TS in FIG. 3.

FIG. 4 is a cross-sectional view of a transistor structure TS in FIG. 3. Referring to FIGS. 2 to 4, an insulating film 116 may include first to third sub-insulating films 117 through 119.

A p-type silicon surface layer 114 of a pillar 113 may act as a body. The first sub-insulating film 117 may act as a tunneling insulating film. For example, the first sub-insulating film 117 adjacent to the pillar 113 may include a thermal oxide layer.

The second sub-insulating film 118 may act as a charge storage film. For example, the second sub-insulating film 118 may act as a charge trap layer. For example, the second sub-insulating film 118 may include a nitride layer or a metal oxide layer (e.g., an aluminum oxide layer, a hafnium oxide layer, or the like).

The third sub-insulating film 119 adjacent to a first conductive material 233 may act as a blocking insulating film. The third sub-insulating film 119 may be a high dielectric layer (e.g., an aluminum oxide layer or a hafnium oxide layer) having a higher dielectric constant than that of the first and second sub-insulating films 117 and 118.

The first conductive material 233 may serve as a gate (or a control gate). That is, the first conductive material 233 may serve as a gate (or a control gate), the third sub-insulating film 119 may serve as the blocking insulating film, the second sub-insulating film 118 may serve as the charge storage layer, the first sub-insulating film 117 may serve as the tunneling insulation layer, and the p-type surface layer 114 may serve as a body, which may form a transistor (or, a memory cell transistor structure). The first through third sub-insulating films 117 through 119 may form oxide-nitride-oxide (ONO). Below, it is assumed that the p-type surface layer 114 of the pillar 113 serves as a second-direction body.

In a memory block BLKi, one pillar 113 may correspond to one cell string NS. The memory block BLKi may include a plurality of pillars 113. That is, the memory block BLKi may include a plurality of cell strings NS. In detail, the memory block BLKi may include a plurality of cell strings NS extending in a z-direction (or, a direction perpendicular to a substrate) in FIG. 2.

Each NAND string NS may include a plurality of transistor structures TS that are stacked along a z-direction in FIG. 2. At least one of the transistor structures TS of each cell string NS may serve as a string selection transistor SST. At least one of the transistor structures TS of each cell string NS may serve as a ground selection transistor GST.

Gates (or control gates) may correspond to the first conductive materials 211 to 291, 212 to 292, and 213 to 293 extending along the y-direction. That is, the gates (or the control gates) may be extended in the y-direction in FIG. 2 to form at least two selection lines SL (e.g., at least one string selection line SSL and at least one ground selection line GSL) and word lines WL.

The second conductive materials 331 to 333 extending in the x-direction in FIG. 2 may be connected to one or more ends of the cell strings NS, respectively. The second conductive materials 331 to 333 may act as bit lines BL. In the memory block BLKi, one bit line may be connected with a plurality of cell strings.

Second-type doping regions 311 through 314 extending in the y-direction may be provided to the other ends of the cell strings NS, respectively. The second-type doping regions 311 through 314 may serve as a common source line CSL.

To sum up the above-described, the memory block BLKi may include a plurality of cell strings that are extended in a direction (i.e., the z-direction) vertical to the substrate 111, and may act as a NAND flash memory block (e.g., a charge trap type) that a plurality of cell strings NS may be connected to one bit line BL.

Figure 5:
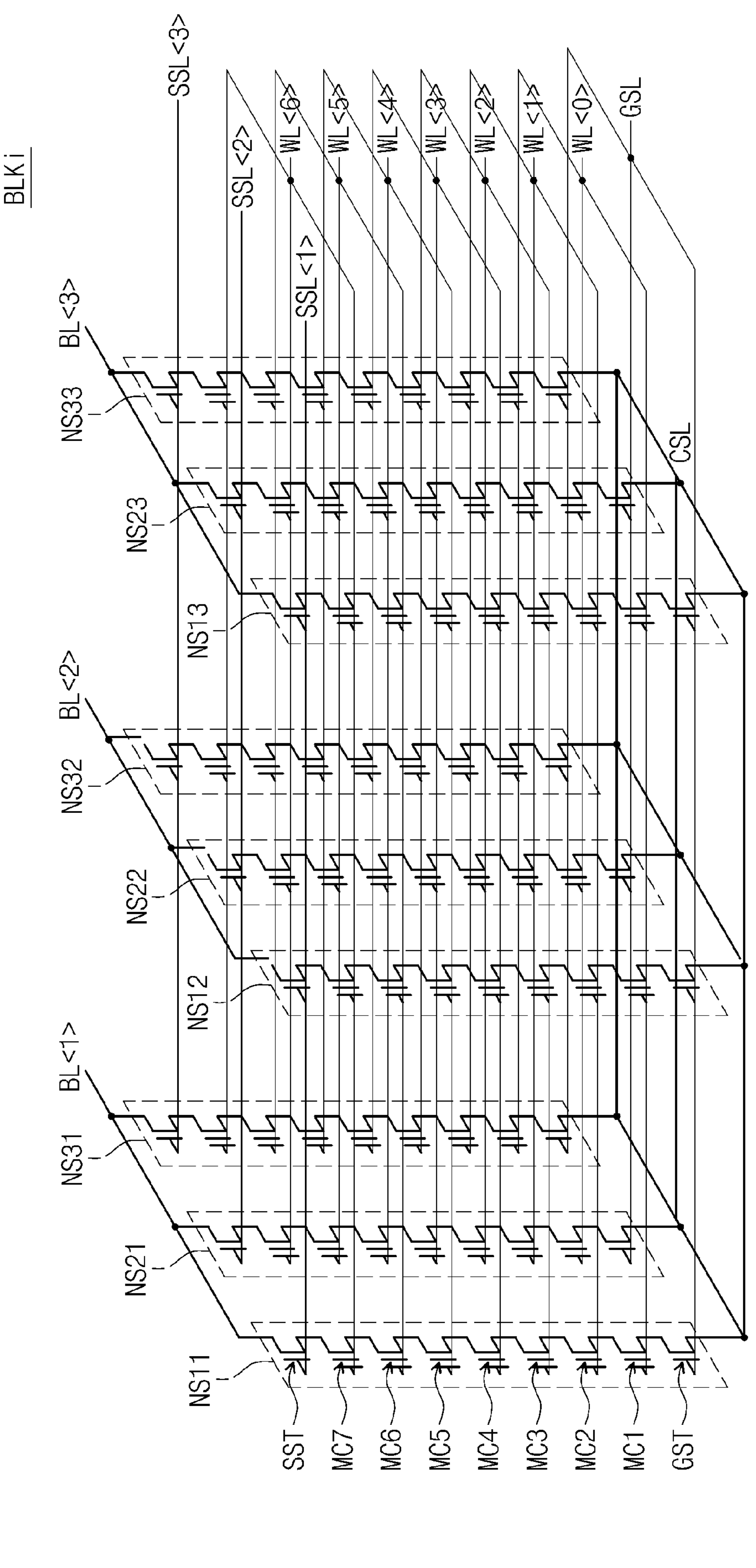
FIG. 5 is an equivalent circuit diagram of a memory block BLKi in FIG. 2.

FIG. 5 is an equivalent circuit diagram of a memory block BLKi in FIG. 2. Referring to FIGS. 2 to 5, NAND strings NS11, NS21, and NS31 may be provided between a first bit line BL<1> and a common source line CSL. NAND strings NS12, NS22, and NS32 may be provided between a second bit line BL<2> and the common source line CSL. NAND strings NS13, NS23, and NS33 may be provided between a third bit line BL<3> and the common source line CSL. The first through third bit lines BL<1> to BL<3> may correspond to second conductive material 331 to 333 extending in an x-direction, respectively.

A string selection transistor SST of each cell string NS may be connected to a corresponding bit line BL. A ground selection transistor GST of each cell string NS may be connected to the common source line CSL. In each cell string NS, memory cells MC1 to MC7 may be provided between the string selection transistor SST and the ground selection transistor GST.

Below, cell strings NS may be defined by the row and by the column. The cell strings NS connected to one bit line in common may form one column. For example, the cell strings NS11 to NS31 connected to the first bit line BL<1> may correspond to a first column. The cell strings NS12 to NS32 connected to the second bit line BL<2> may correspond to a second column. The cell strings NS13 to NS33 connected to the third bit line BL<3> may correspond to a third column.

The cell strings NS connected to one string selection line SSL may form one row. For example, the cell strings NS11 through NS13 connected to a first string selection line SSL<1> may form a first row. The cell strings NS21 through NS23 connected to a second string selection line SSL<2> may form a second row. The cell strings NS31 to NS33 connected to a third string selection line SSL<3> may form a third row.

Each cell string NS may include a ground selection transistor GST. The ground selection transistors may be controlled by a ground selection line GSL. Alternatively, although not shown in FIG. 5, cell strings corresponding to each row can be controlled by different ground selection lines. For example, ground selection transistors in cell strings NS11, NS12, and NS13 corresponding to a first row may be connected to a first ground selection line GSL1. Ground selection transistors in cell strings NS21, NS22, and NS23 corresponding to a second row may be connected to a second ground selection line GSL2. Ground selection transistors in cell strings NS31, NS32, and NS33 corresponding to a third row may be connected to a third ground selection line GSL3.

Referring to FIGS. 3 and 5, memory cells located at the same semiconductor layer may share a word line WL. Conductive lines 221 to 223 may be connected in common to form a first word line WL<0>. Conductive lines 231 to 233 may be connected in common to form a second word line WL<1>. Conductive lines 241 to 243 may be connected in common to form a third word line WL<2>. Conductive lines 251 to 253 may be connected in common to form a fourth word line WL<3>. Conductive lines 261 to 263 may be connected in common to form a fifth word line WL<4>. Conductive lines 271 to 273 may be connected in common to form a sixth word line WL<5>. Conductive lines 281 to 283 may be connected in common to form a seventh word line WL<6>.

Cell strings in the same row may share a string selection line SSL. Cell strings in different rows may be connected to different string selection lines SSL<1>, SSL<2>, and SSL<3>, respectively. Below, the first string selection transistors SST1 may be defined as string selection transistors SST connected to the first string selection line SSL<1>. The second string selection transistors SST2 may be defined as string selection transistors SST connected to the second string selection line SSL<2>. The third string selection transistors SST2 may be defined as string selection transistors SST connected to the third string selection line SSL<3>.

The common source line CSL may be connected in common to cell strings NS. For example, first through fourth doping regions 311 through 314 may be interconnected to form the common source line CSL.

One memory block BLKi may be divided into a plurality of string units sharing one string selection line SSL. That is, the memory block BLKi may be divided into a plurality of sub-blocks each of which is formed of a plurality of cell strings sharing one string selection line SSL. A partial alternate programming (PA_PGM) manner may be applied to a sub-block unit smaller than one memory block.

Cell strings NS11, NS12, and NS13 sharing a first string selection line SSL<1> may form a first sub-block SB1. Cell strings NS21, NS22, and NS23 sharing a second string selection line SSL<2> may form a second sub-block SB2. Cell strings NS31, NS32, and NS33 sharing a third string selection line SSL<3> may form a third sub-block SB3. Although nine cell strings in FIG. 5 are divided into three sub-blocks for example, this division may be applied regardless of the number of cell strings.

The partial alternate programming (PA_PGM) manner of the inventive concept may be applied to a sub-block unit. For example, in the event that memory cells of a memory block BLK1 are 3-bit multi-level cells, first and second page portions of the memory block BLK1 may be programmed according to an alternate programming manner. Data may be sequentially programmed at third page portions according to a word line order.

As described herein, the partial alternate programming manner of the inventive concept may be applied by a sub-block unit sharing a string selection line SSL. However, the inventive concept is not limited thereto. A memory block BLKi including a plurality of sub-blocks SB1, SB2, and SB3, and being an erase unit, may be a unit in which the partial alternate programming manner of the inventive concept is applied. For example, first and second page portions of all memory cells of the memory block BLKi may be programmed according to an alternate programming manner. Data may be sequentially programmed at third page portions according to a word line order. Compared with the case that all pages are stored according to the alternate programming manner, the number of memory cells programmed to the uppermost state may be reduced by the above-described programming method. The alternate programming manner will be described in detail from FIGS. 6A and 6B.

FIGS. 6A and 6B are tables illustrating a programming method according to an embodiment of the inventive concept. Referring to FIG. 6A, there is illustrated a programming sequence according to a partial alternate (PA_PGM) programming manner of the inventive concept. It is assumed that memory cells of a memory block (or, a sub block) at which data is stored are connected to 16 word lines WL<0> to WL<15>. Further, it is assumed that data to be programmed at a memory block is formed of 39 pages (e.g., 39×4 Kbyte/page).

Thirty-two (32) pages of data may be alternately programmed at first and second page portions according to the partial alternate (PA_PGM) programming manner of the inventive concept. First, the first page portion and the second page portion other than a third page portion (or, MSB page portion) may be alternately programmed by an alternate programming sequence or order. Then, the remaining pages of data, that is, $32^{th}$ to $38^{th}$ pages of data may be sequentially programmed at the third page portion according to a word line order or sequential order.

Below, a partial alternate programming manner will be more fully described. First, a first page portion and a second page portion may be programmed. Memory cells of a selected memory block (or, a selected memory space) may be programmed according to a programming sequence: WL<0>→WL<1>→WL<0>→WL<2>→WL<1>→WL<3>→WL<2>→WL<4>, etc. That is, a 1st page of write data may be programmed at a first page portion (or, an LSB page) associated with a word line WL<0>. A 2nd page of write data may be programmed at a first page portion (or, an LSB page) associated with a word line WL<1>. A 3rd page of write data may be programmed at a second page portion associated with the word line WL<0>. A 4th page of write data may be programmed at a first page portion (or, an LSB page) associated with a word line WL<2>. A 5th page of write data may be programmed at a second page portion associated with the word line WL<1>. A 6th page of write data may be programmed at a first page portion (or, an LSB page) associated with a word line WL<3>. A 7th page of write data may be programmed at a second page portion associated with the word line WL<2>. Thirty-two (32) pages of write data may be alternately programmed at the first and second page portions in an alternate programming manner according to the above-described programming sequence or order.

Thirty-two (32) pages of write data may be alternately programmed at the first and second page portions of a memory block according to the alternate programming manner. Afterwards, word lines may be selected not alternately, but sequentially according to an arrangement order such that $32^{th}$ to $38^{th}$ pages of write data may be programmed at the third page portions. To write $32^{th}$ to $38^{th}$ pages of write data at the third page portions of a selected memory block, word lines or rows may be selected according to a selection sequence: WL<0>→WL<1>→WL<2>→> WL<3>→WL<4>→WL<5>→WL<6>.

The number of memory cells of MSB page portions (e.g., 3rd pages) filled by data may be reduced by programming data according to the partial alternate programming (PA_PGM) manner of the inventive concept. That is, in the event that 39 pages of data are programmed at a 3-bit MLC memory block having a 48-page size, the third page portions of memory cells corresponding to nine rows WL<7> to WL<15> may be empty (or, may not be filled). The highest program state of memory cells connected to the nine word lines WL<7> to WL<15> may be a program state P3 of eight states. On the other hand, the highest program state of memory cells connected to the seven word lines WL<0> to WL<6> may be a program state P7 of the eight states. Compared with memory cells connected to the word lines WL<0> to WL<6> the three page portions of which are all programmed, the program disturbance may be remarkably reduced, which is generated from memory cells connected to word lines WL<7> to WL<16>.

Herein, in the event that write data assigned to a memory block is formed of less than 32 pages, it may be written at the first and second page portions in the alternate programming manner. A write operation of the memory block may be ended before a programming procedure of a word line WL<15 >. With the partial alternate programming manner of the inventive concept, memory cells of the third page portions being empty may correspond to the nine word lines WL<7> to WL<15>. On the other hand, in case of a full alternate programming (FA_PGM) manner in which all page portions are programmed in an alternate programming manner in FIG. 6B, four word lines WL<12> to WL<15> may exist, which are connected with memory cells of the third page portions being empty.

With the above description, in a case where a memory block is not fully filled with assigned data, improvement of a program disturbance characteristic may be expected by the partial alternate programming (PA_PGM) manner, rather than the full alternate programming (FA_PGM) manner.

FIG. 7 is a table illustrating a method for programming a vertical nonvolatile memory device according to an embodiment of the inventive concept. Referring to FIGS. 6A, 6B and 7, tables illustrate a method for programming memory blocks BLK1 to BLK3 of a vertical nonvolatile memory device.

It is assumed that a memory cell array is formed of three memory blocks BLK1 to BLK3 and 117 pages of write data is received. In this case, 39 pages of write data may be assigned to the memory blocks BLK1 to BLK3, respectively. At a program operation, 32 pages of write data of the assigned 39-page write data may be programmed at first and second page portions of each memory block in an alternate programming manner. In each memory block, the remaining pages of write data, that is, 8 pages of write data may be programmed at third page portions sequentially according to a row order. In this case, each of the memory blocks BLK1 to BLK3 may include nine rows, the third page portions of which are empty. That is, the memory blocks BLK1 to BLK3 may include a total of 27 rows, the third page portions of which are empty.

If three memory blocks are programmed according to a full alternate programming (FA_PGM) manner instead of a partial alternate programming (PA_PGM) manner, two memory blocks may not include a row having a third page portion being empty. On the other hand, one memory block may include 10 rows each having a third page portion being empty. As the partial alternate programming (PA_PGM) manner of the inventive concept is used, there may exist 17 rows each having a third page portion being empty.

The inventive concept is described under the condition that the partial alternate programming (PA_PGM) manner is applied by a memory block unit.

However, the inventive concept is not limited thereto. The partial alternate programming (PA_PGM) manner may be applied by a unit of cell strings (constituting a sub block) sharing a string selection line.

Figure 8:
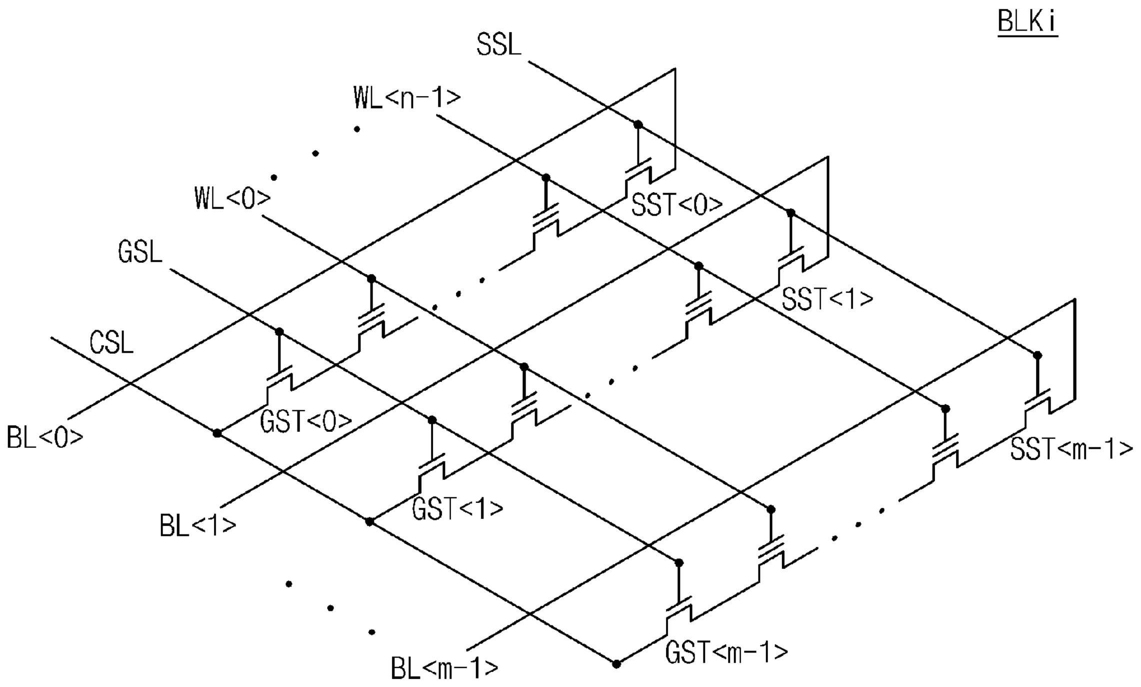
FIG. 8 is a circuit diagram illustrating a memory block according to another embodiment of the inventive concept.

FIG. 8 is a circuit diagram illustrating a memory block according to another embodiment of the inventive concept. Referring to FIG. 8, there is illustrated a cell array structure in which cell strings of a memory block are arranged in parallel with a substrate. The memory block BLKi may include a plurality of cell strings connected to a plurality of bit lines BL<0> to BL<m−1>, respectively.

Each cell string may include a plurality of memory cells connected between a corresponding bit line and a common source line CSL. Each cell string may include a string selection line SST connected to a string selection line SSL, a plurality of memory cells connected to a plurality of word lines WL<0> to WL<n−1>, and a ground selection transistor GST connected to a ground selection line GSL.

A string selection transistor SST<0> may be connected to a bit line BL<0>, and a ground selection transistor GST<0> may be connected to the common source line CSL. A string selection transistor SST<1> may be connected to a bit line BL<1>, and a ground selection transistor GST<1> may be connected to the common source line CSL. A string selection transistor SST<m−1> may be connected to a bit line BL<m−1>, and a ground selection transistor GST<m−1> may be connected to the common source line CSL.

An operation of writing data at a memory block BLKi may be performed according to a partial alternate programming manner. That is, in all word lines of the memory block BLKi, first and second page portions may be programmed according to an alternate programming manner and third page portions may be sequentially programmed according to an order of word lines.

A memory block BLKi having cell strings formed at the same semiconductor layer in a planar direction is described with reference to FIG. 8. However, the inventive concept may be applied to a nonvolatile memory device including memory blocks, each of the memory blocks having cell strings that are formed in a planar direction and that are stacked on a substrate. A data write operation using a partial alternate programming manner of the inventive concept may be applied to a nonvolatile memory device in which memory blocks are formed at different semiconductor layers.

FIG. 9 is a table illustrating a data writing method applied to a memory block having planar cell strings. Referring to FIG. 9, there is illustrated a sequence in which write data is written at a memory block including planar cell strings. A programming sequence according to a partial alternate programming (PA_PGM) manner of the inventive concept is illustrated in FIG. 9. For ease of description, it is assumed that a memory block includes memory cells in which data is stored in practice and which are connected to 16 word lines WL<0> to WL<15>. Further, it is assumed that data to be stored at a memory block is formed of 39 pages of data (e.g., one page having a size of 4 Kbyte).

Thirty-two (32) pages of write data (0 to 31) may be alternately written at a memory block in a partial alternate programming (PA_PGM) manner according to an embodiment of the inventive concept. At this time, an alternate programming manner may be applied to a first page portion and a second page portion other than a third page portion (or, an MSB page portion). Thirty-two (32) pages of write data may be written at the first and second page portions in the alternate programming manner. Then, 7 pages of write data (32 to 38) may be sequentially programmed at the third page portions of the memory block according to a row arrangement order.

Below, a partial alternate programming manner will be more fully described. First, a first page portion and a second page portion may be programmed. Memory cells of a selected memory block (or, a selected memory space) may be programmed according to a programming sequence: WL<0>→WL<1>→WL<0>→> WL<2>→WL<1>→WL<3>→WL<2>→WL<4>, etc. That is, a 1st page of write data may be programmed at a first page portion (or, an LSB page) associated with a word line WL<0>. A 2nd page of write data may be programmed at a first page portion (or, an LSB page) associated with a word line WL<1>. A 3rd page of write data may be programmed at a second page portion associated with the word line WL<0>. A 4th page of write data may be programmed at a first page portion (or, an LSB page) associated with a word line WL<2>. A 5th page of write data may be programmed at a second page portion associated with the word line WL<1>. A 6th page of write data may be programmed at a first page portion (or, an LSB page) associated with a word line WL<3>. A 7th page of write data may be programmed at a second page portion associated with the word line WL<2>. Thirty-two (32) pages of write data may be alternately programmed at the first and second page portions in an alternate programming manner according to the above-described programming sequence.

Thirty-two (32) pages of write data may be alternately programmed at the first and second page portions of a memory block according to the alternate programming manner. Afterwards, word lines may be selected not alternately, but sequentially according to an arrangement order such that 32th to $38^{th}$ pages of write data may be programmed at the third page portions. To write 32th to $38^{th}$ pages of write data at the third page portions of a selected memory block, word lines or rows may be selected according to a selection sequence: WL<0>→WL<1>→WL<2>→> WL<3>→WL<4>→WL<5>→WL<6>.

The number of memory cells of MSB page portions (e.g., $3^{rd}$ pages) filled by data may be reduced by programming data according to the partial alternate programming (PA_PGM) manner of the inventive concept.

Figure 10A:
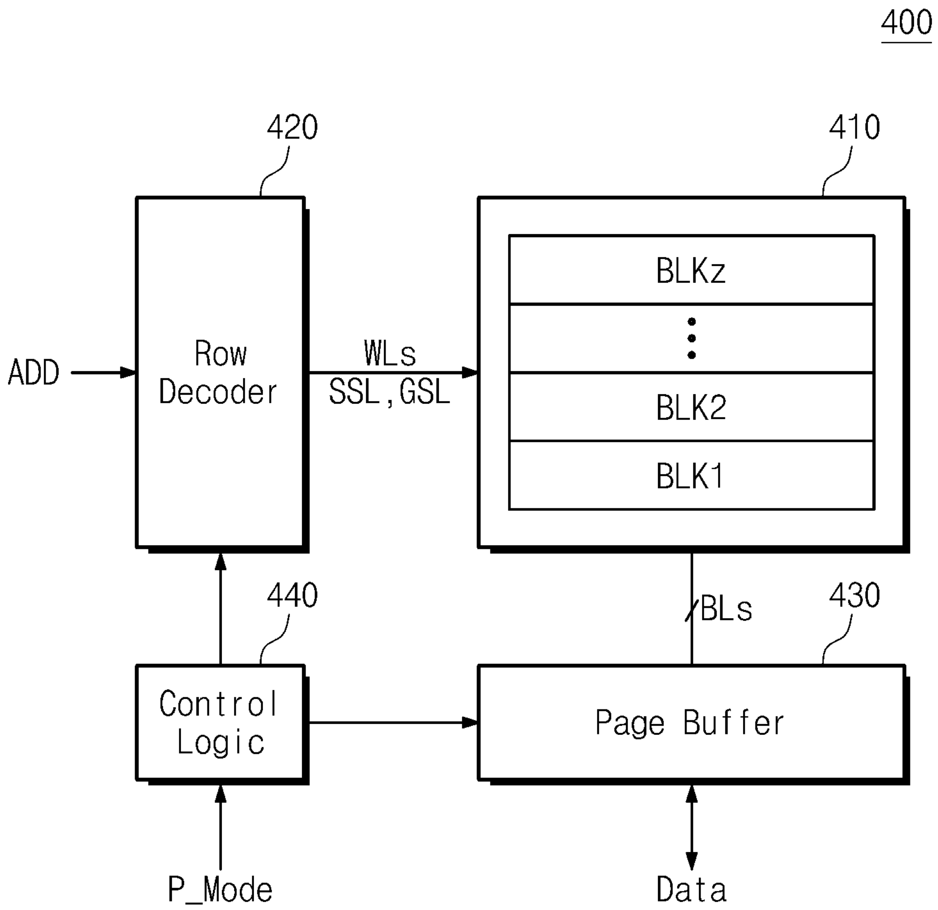
FIGS. 10A and 10B are a block diagram schematically illustrating a nonvolatile memory device and a timing diagram according to another embodiment of the inventive concept.
Figure 10B:
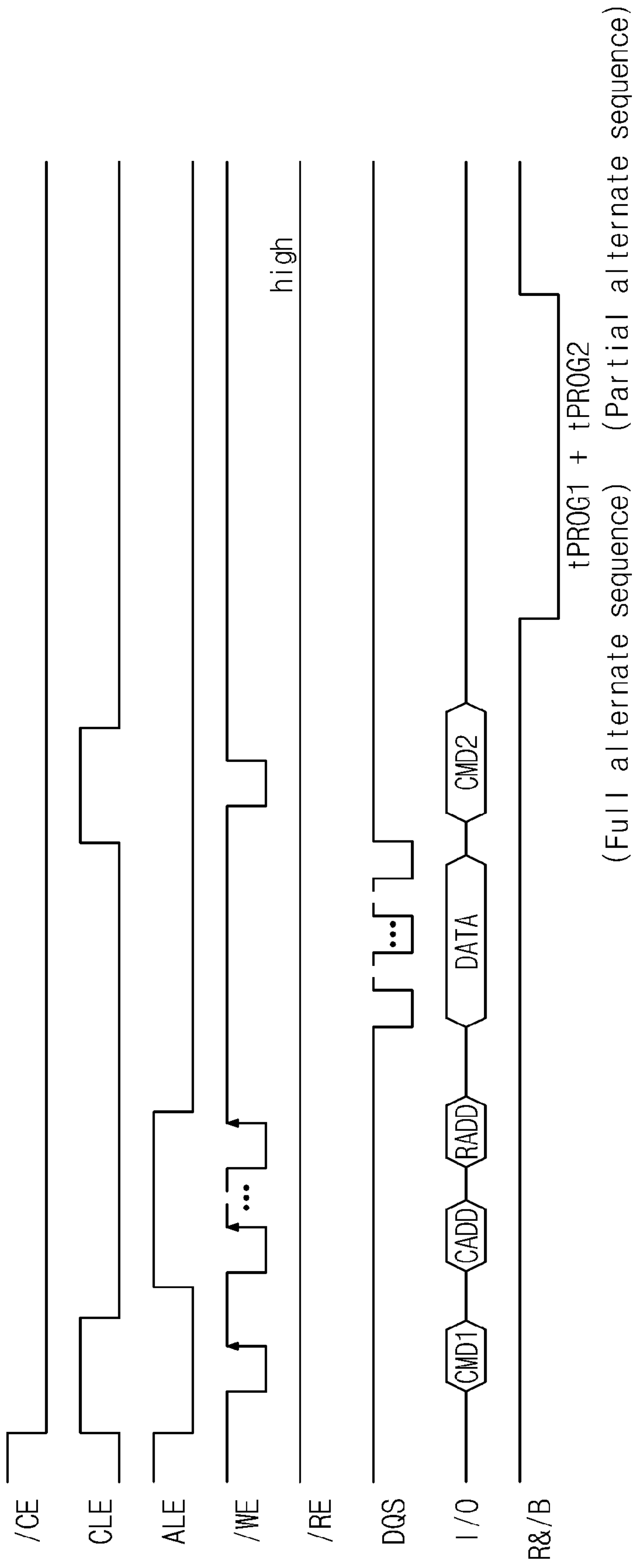

FIGS. 10A and 10B are a block diagram schematically illustrating a nonvolatile memory device and a timing diagram according to another embodiment of the inventive concept. Referring to FIG. 10A, a nonvolatile memory device 400 may include a memory cell array 410, a row decoder 420, a page buffer 430, and control logic 440. The control logic 440 may be configured to apply a partial alternate programming (PA_PGM) manner to a selected memory unit (or, a selected memory space/area) according to a programming mode P_Mode provided from an external device.

The memory cell array 410, the row decoder 420, and the page buffer 430 may be substantially equal to those in FIG. 1, and description thereof is thus omitted.

The control logic 440 may control the row decoder 420 and the page buffer 430 according to a command and a programming mode P_Mode information transferred from an external device. The control logic 440 may select a programming manner associated with a selected memory unit (e.g., a memory block, a sub block, a super block including a plurality of memory blocks, etc.) according to the programming mode P_Mode at a program operation. The control logic 440 may control the row decoder 420 and the page buffer 430 to program input data in a partial alternate programming manner or a full alternate programming manner according to the programming mode P_Mode.

The control logic 440 may selectively perform a write operation on a selected memory unit according to the control of an external device. The number of memory cells, programmed to the uppermost state, from among memory cells of a selected memory unit may be remarkably reduced by the control logic 440.

The nonvolatile memory device 400 of the inventive concept may be configured to program a selected memory unit in a partial alternate programming (PA_PGM) manner of the inventive concept. At a write operation, a selected memory unit may be accessed according to a programming mode P_Mode provided from an external device. With the nonvolatile memory device 400 of the inventive concept, it is possible to flexibly perform the partial alternate programming (PA_PGM) operation on various memory units. For example, a memory block may be programmed in a full alternate programming (FA_PGM) manner, and another memory block may be programmed in the partial alternate programming (PA_PGM) manner.

Referring to FIG. 10B, the P_Mode information can be delivered by a command through an I/O bus of the nonvolatile memory device 400. For example, the command can be SET_FEATURE command or a program command of the nonvolatile memory device 400. CMD1 may a partial alternate program command and CMD2 may a confirm command. In case of the SET FEATURE command, the confirm command may be skipped. CADD may be a column address of the write data DATA and RADD may be a row address of the write data DATA. Other control signals such as /CE (Chip Enable), CLE (Command Latch Enable), ALE (Address Latch Enable), /WE (Write Enable), /RE (Read Enable), DQS (Data Strobe) and R&B (Ready/Busy) also can be provided on an appropriate time sequence. DQS can be a differential signal for data strobe at dual edges compatible to a toggle DDR flash interface. The Busy status of R/B signal may include the program time according to full alternate sequence or partial alternate sequence.

FIGS. 11A and 11B are tables illustrating a full alternate programming method and a partial alternate programming method, respectively, of a nonvolatile memory device in FIG. 10. In FIG. 11A, there is illustrated a program procedure at a programming mode P_Mode corresponding to a full alternate programming method. In FIG. 11B, there is illustrated a program procedure at a programming mode P_Mode corresponding to a partial alternate programming method.

Referring to FIG. 11A, there is illustrated a program procedure of a 3-bit MLC block when a programming mode P_Mode provided from an external device corresponds to a full alternate programming (FA_PGM) manner. Thirty-nine

(39) pages of write data (0 to 38) may be written at a memory block in an alternate programming manner according to the full alternate programming manner. At this time, the alternate programming manner may be applied to a first page portion (or, an LSB page) to a third page portion (or, an MSB page). That is, all page portions of a memory block formed of 3-bit multi-level cells may be programmed according to the alternate programming method.

The full alternate program operation will be performed as follows.

Memory cells of a memory block may be programmed according to a programming sequence: WL<0>→WL<1>→WL<0>→WL<2>→WL<1>→WL<0>→WL<3>→WL<2>→WL<1>→WL<4>→WL<3>→WL<2>, etc. That is, a 1st page of write data may be programmed at a first page portion (or, an LSB page) associated with a word line WL<0>. A 2nd page of write data may be programmed at a first page portion (or, an LSB page) associated with a word line WL<1>. A 3rd page of write data may be programmed at a second page portion associated with the word line WL<0>. A 4th page of write data may be programmed at a first page portion (or, an LSB page) associated with a word line WL<2>. A 5th page of write data may be programmed at a second page portion associated with the word line WL<1>. A 6th page of write data may be programmed at a third page portion (or, an MSB page) associated with the word line WL<0>. At the full alternate program operation, the first to third page portions $1^{st}$ page to $3^{rd}$ page of memory cells may be sequentially selected and programmed.

The full alternate program operation may be ended by writing a $38^{th}$ page of write data at a third page portion of memory cells corresponding to a word line WL<11> according to the above-describe program procedure. After the memory block is programmed with 39 pages of write data, four word lines WL<12> to WL<15> may include third page portions (or, MSB page portions) being empty.

In FIG. 11B, there is illustrated a program procedure on a selected memory unit at a programming mode P_Mode corresponding to a partial alternate programming method.

Referring to FIG. 11B, 32 pages of write data (0 to 31) may be programmed at a memory block in an alternate programming manner according to the partial alternate (PA_PGM) programming manner of the inventive concept. At this time, the first page portion and the second page portion other than a third page portion (or, MSB page portion) may be alternately programmed by an alternate programming sequence. Thirty-two (32) pages of data may be written at the first and second page portions in the alternate programming manner.

Below, a partial alternate programming manner will be more fully described. First, a first page portion and a second page portion may be programmed. Memory cells of a selected memory block (or, a selected memory space) may be programmed according to a programming sequence: WL<0>→WL<1>→WL<0>→> WL<2>→WL<1>→WL<3>→WL<2>→WL<4>, etc.

That is, a 1st page of write data may be programmed at a first page portion (or, an LSB page) associated with a word line WL<0>. A 2nd page of write data may be programmed at a first page portion (or, an LSB page) associated with a word line WL<1>. A 3rd page of write data may be programmed at a second page portion associated with the word line WL<0>. A 4th page of write data may be programmed at a first page portion (or, an LSB page) associated with a word line WL<2>. A 5th page of write data may be programmed at a second page portion associated with the word line WL<1>. A 6th page of write data may be programmed at a first page portion (or, an LSB page) associated with a word line WL<3>. A 7th page of write data may be programmed at a second page portion associated with the word line WL<2>. Thirty-two (32) pages of write data may be alternately programmed at the first and second page portions in an alternate programming manner according to the above-described programming sequence.

Thirty-two (32) pages of write data may be alternately programmed at the first and second page portions of a memory block according to the alternate programming manner. Afterwards, $32^{th}$ to $38^{th}$ pages of write data may be programmed at the third page portions. That is, word lines may be selected not alternately, but sequentially according to an arrangement order such that $32^{th}$ to $38^{th}$ pages of write data may be programmed at the third page portions. To write $32^{th}$ to $38^{th}$ pages of write data at the third page portions of a selected memory block, word lines or rows may be selected according to a programming sequence: WL<0>→WL<1>→WL<2>→WL<3>→WL<4>→WL<5>→WL<6>.

The number of memory cells of MSB page portions (e.g., 3rd pages) filled by data may be reduced by programming data according to the partial alternate programming (PA_PGM) manner of the inventive concept. That is, in the event that 39 pages of data are programmed at a 3-bit MLC memory block having a 48-page size, the third page portions of memory cells corresponding to nine rows WL<7> to WL<15> may be empty (or, may not be filled). The highest program state of memory cells connected to the nine word lines WL<7> to WL<15> may be a program state P3 of eight states. On the other hand, the highest program state of memory cells connected to the seven word lines WL<0> to WL<6> may be a program state P7 of the eight states. Compared with memory cells connected to the word lines WL<0> to WL<6>, the three page portions of which are all programmed, the program disturbance may be remarkably reduced, which is generated from memory cells connected to word lines WL<7> to WL<16>.

The partial alternate program operation may be ended by writing a $38^{th}$ page of write data at a third page portion of memory cells corresponding to a word line WL<6> according to the above-describe program procedure. However, after the memory block is programmed with 39 pages of write data, nine word lines WL<7> to WL<15> may include third page portions (or, MSB page portions) that are empty. Thus, a partial alternate programming (PA_PGM) manner may be more advantageous than a programming mode of a full alternate programming (FA_PGM) manner to interrupt the program disturbance.

If all pages of a memory block are programmed according to the partial alternate programming (PA_PGM) manner, the number of memory cells programmed to the uppermost state may be equal to that of the full alternate programming manner. The partial alternate programming manner of the inventive concept may be advantageous in the case that a size of data to be written is smaller than that of a memory unit (e.g., a memory block). Thus, a programming mode P_Mode may be selected according to a size of data provided from an external device.

Figure 12:
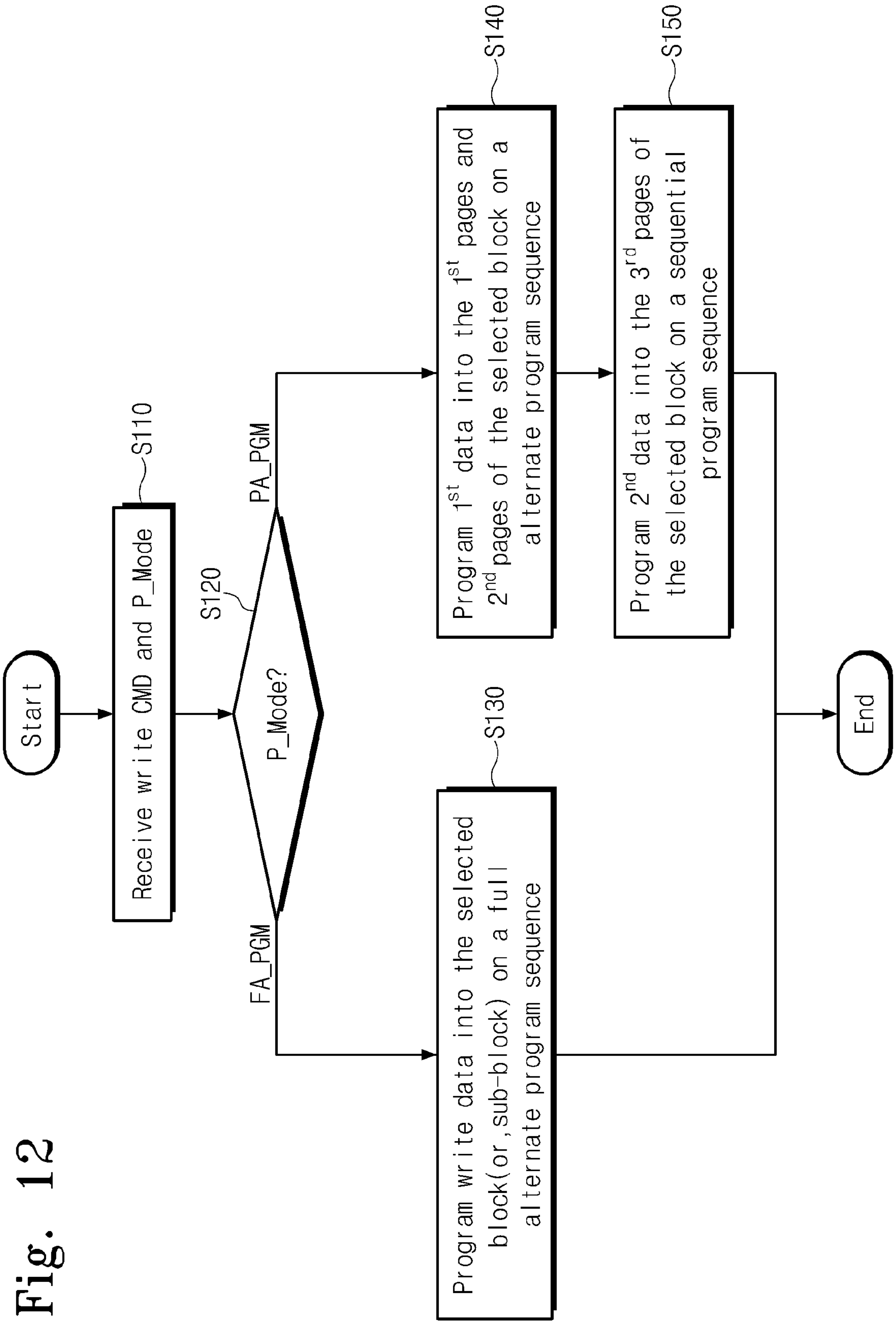
FIG. 12 is a flowchart illustrating a programming method of a nonvolatile memory device in FIG. 10.

FIG. 12 is a flowchart illustrating a method for programming a nonvolatile memory device in FIG. 10A. Referring to FIG. 10A, a nonvolatile memory device 400 may operate on a selected memory unit according to a programming mode P_Mode.

In operation S110, a write command and programming mode P_Mode information provided from an external device may be transferred to control logic 440 as described in FIG. 10B. In addition, an address and write data may be provided as shown in FIG. 10B.

In operation S120, the control logic 440 may judge whether the input programming mode P_Mode indicates a partial alternate programming (PA_PGM) manner (or, sequence) or a full alternate programming (FA_PGM) manner (or, sequence). When the input programming mode P_Mode is judged to indicate the full alternate programming (FA_PGM) manner, the method proceeds to operation S130. When the input programming mode P_Mode is judged to indicate the partial alternate programming (PA_PGM) manner, the method proceeds to operation S140.

In operation S130, the control logic 440 may control a row decoder 420 and a page buffer 430 to program write data input from the external device at a selected memory area unit (e.g., a memory block, a sub block, or a super block) according to the full alternate programming (FA_PGM) manner.

In operation S 140, the control logic 440 may control the row decoder 420 and the page buffer 430 to program write data input from the external device at a selected memory area unit (e.g., a memory block, a sub block, or a super block) according to the partial alternate programming (PA_PGM) manner. That is, the control logic 440 may control the row decoder 420 and the page buffer 430 to program first data of the write data at a first page portion and a second page $2^{nd}$ page in an alternate programming manner.

In operation S 150, second data, not programmed at operation S 140, from among the input write data may be sequentially programmed at third page portions of the selected memory area unit. The control logic 440 may control the row decoder 420 and the page buffer 430 to program second data of the input write data at a third page portion of the selected memory area unit. When the second data is programmed, word lines of the selected memory area unit may be selected not alternately, but sequentially.

In the event that a selected memory unit is accessed according to a programming mode P_Mode provided from an external device at a data writing operation, it is possible to flexibly perform the partial alternate programming (PA_PGM) operation on various memory units. For example, a memory block may be programmed in the full alternate programming (FA_PGM) manner, and another memory block may be programmed in the partial alternate programming (PA_PGM) manner. This programming method may include both a merit of the partial alternate programming (PA_PGM) and a merit of the full alternate programming (FA_PGM) manner.

Figure 13:
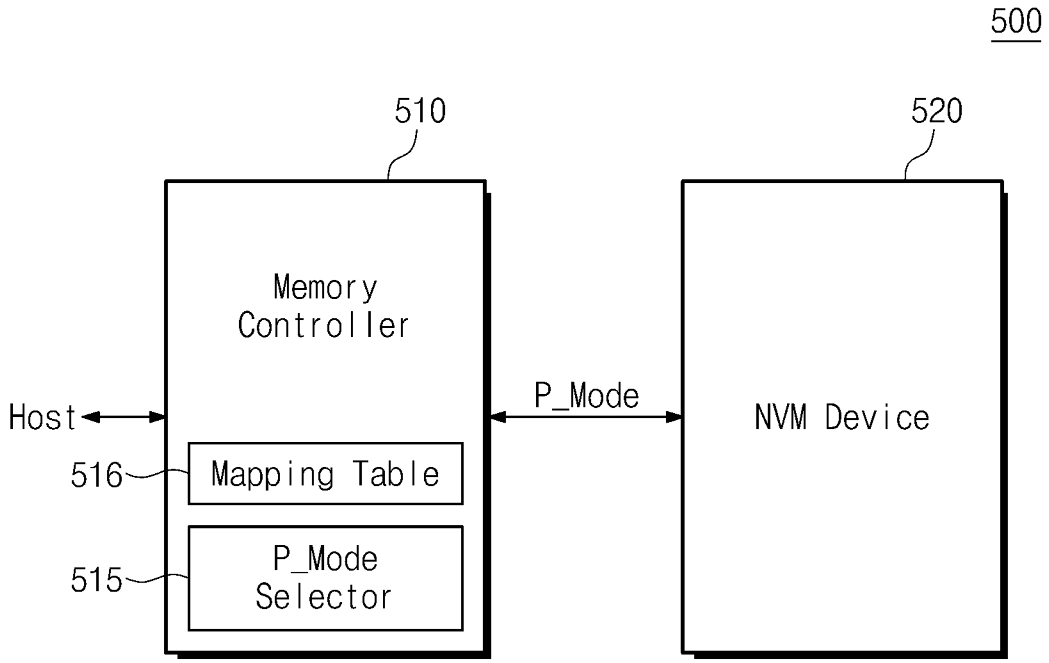
FIG. 13 is a block diagram schematically illustrating a memory system according to an embodiment of the inventive concept.

FIG. 13 is a block diagram schematically illustrating a memory system according to an embodiment of the inventive concept. Referring to FIG. 13, a memory system 500 may include a memory controller 510 and a nonvolatile memory device 520. Herein, the nonvolatile memory device 520 may be a vertical nonvolatile memory device, which includes cell strings formed in a direction perpendicular to a substrate. Alternatively, the nonvolatile memory device 520 may be a planar nonvolatile memory device, which includes cell strings formed in parallel with the substrate. Alternatively, the nonvolatile memory device 520 may be formed of a nonvolatile memory device 100 in FIG. 1 or a nonvolatile memory device 400 in FIG. 10.

The memory controller 510 may access the nonvolatile memory device 520 according to a write request of an external device (or, a host). The memory controller 510 may determine a programming mode P_Mode based on a size, characteristics of write-requested data or empty space of the nonvolatile memory device 520. The characteristics of write-requested data may be whether the write-requested data is a meta data or user data or whether the write-requested data is hot data, which is frequently used or cold data, which is not frequently used. On the other hand, the more empty blocks the memory system has, the more the partial alternate programming manner can be utilized. The programming mode P_Mode may be a partial alternate programming (PA_PGM) mode or a full alternate programming (FA_PGM) mode. When a size of write-requested data is smaller than a size of a memory block, the memory controller 510 may control the nonvolatile memory device 520 such that a selected memory block is programmed at the partial alternate programming (PA_PGM) manner. When a size of write-requested data is equal to a size of a memory block, the memory controller 510 may control the nonvolatile memory device 520 such that a selected memory block is programmed at the full alternate programming (FA_PGM) manner.

The memory controller 510 may include a programming mode selector 515. The programming mode selector 515 may determine the programming mode P_Mode for writing of an assigned memory block based on a size of write-requested data. When a size of write-requested data correspond to a plurality of memory blocks, the programming mode selector 515 may select the programming mode P_Mode such that the full alternate programming manner is applied to a part of selected memory blocks. The programming mode selector 515 can select the programming mode P_Mode such that the partial alternate programming manner is applied to one memory block, not filled with data, from among the selected memory blocks. The mapping information on the assigned blocks for the defined programming mode P_Mode may be stored in a P_Mode mapping table 516 or may be stored in NVM device 520, for example, in a dummy bytes area in word lines of the NVM device 520.

If write data having a size corresponding to 3 and a half memory blocks are input, the memory controller 510 may control the nonvolatile memory device 520 such that three memory blocks may be programmed according to the full alternate programming manner. Further, the memory controller 510 may control the nonvolatile memory device 520 such that write data corresponding to a size of half a memory block may be programmed according to the partial alternate programming manner. This programming method may include both a merit of the partial alternate programming (PA_PGM) and a merit of the full alternate programming (FA_PGM) manner.

FIG. 14 shows tables illustrating a method for programming a memory system in FIG. 13. Referring to FIG. 14, upon a write request on a streaming file such as multimedia data, a memory controller 510 may perform a program operation using both a full alternate programming manner and a partial alternate programming manner.

It is assumed that 178 pages of write data are provided to a memory system 500 from an external device. Also, it is assumed that each memory block is formed of 3-bit multi-level cells connected with 16 word lines (or, rows). With this assumption, the memory controller 510 may assign write data to four memory blocks BLK0 to BLK3. For example, 48 pages of write data may be assigned to three memory blocks BLK0 to BLK2, and 34 pages of write data may be assigned to one memory block BLK3. A full alternate programming (FA_PGM) manner may be applied to the memory blocks BLK0 to BLK2, all memory areas of which are fully filled with data. A partial alternate programming (PA_PGM) may be applied to the memory block BLK3.

The reliability of data of a memory block, all pages of which are fully filled with data, may become high via the full alternate programming manner associated with the memory blocks BLK0 to BLK2. In the memory block BLK3 where data is stored at a part of memory blocks, the number of memory cells programmed to the uppermost state may be reduced by the partial alternate programming (PA_PGM) manner. Thus, the program disturbance generated at a program operation of the memory block BLK3 may be reduced.

Figure 15:
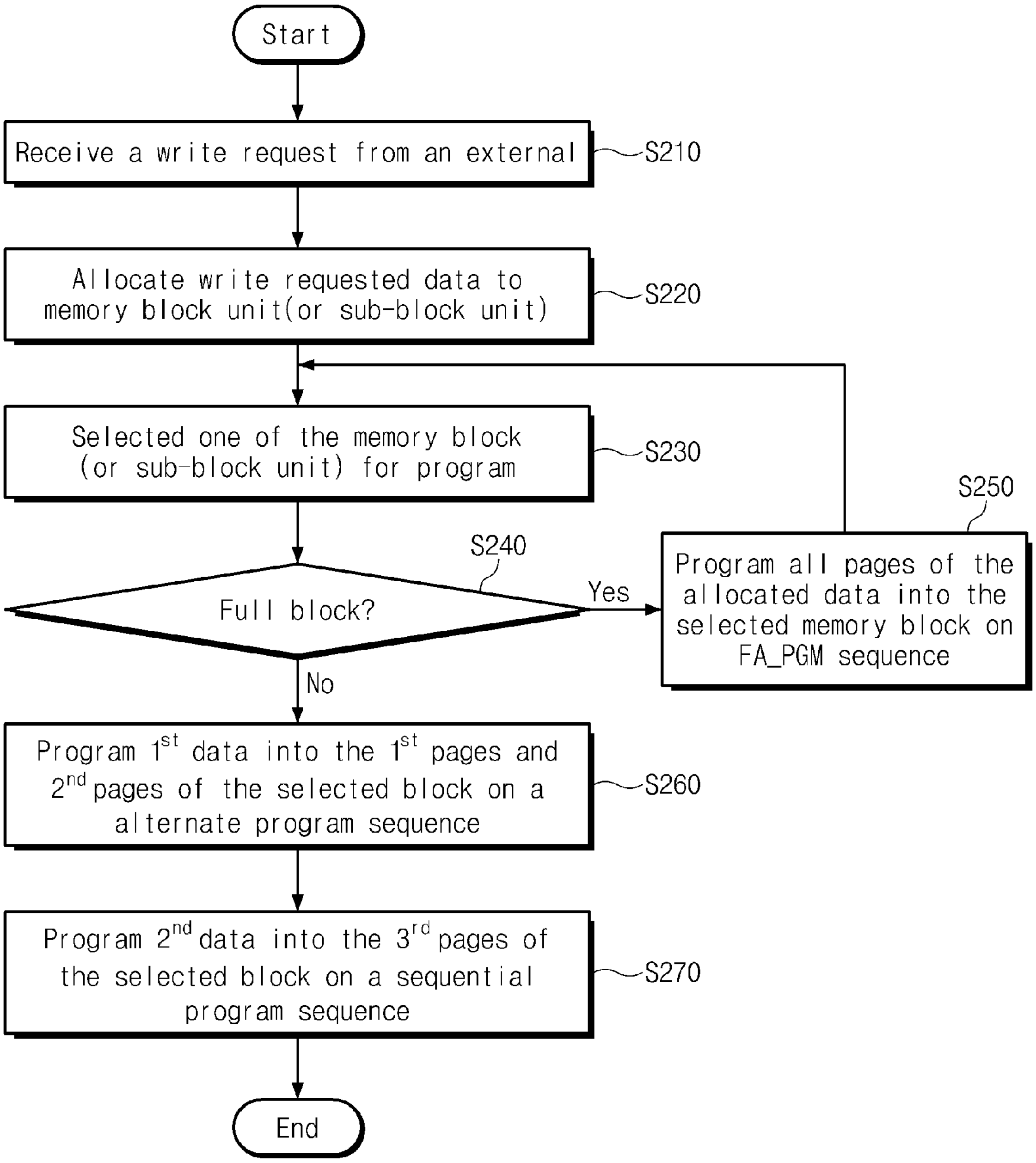
FIG. 15 is a flowchart illustrating a programming method of a memory system in FIG. 13.

FIG. 15 is a flowchart illustrating a method for programming a memory system in FIG. 13. A memory controller 510 (as shown in FIG. 13) may selectively perform a full alternate programming (FA_PGM) operation or a partial alternate programming (PA_PGM) operation according to whether an assigned memory block is filled by write data.

In operation S210, the memory controller 510 may receive a write request from an external device.

In operation S220, the memory controller 510 may assign a memory block (or, a sub block, a super block, etc.) to store write-requested data. If a size of the write-requested data corresponds to 3 and a half memory blocks, the write-requested data (or, write data) may be assigned such that three memory blocks are fully filled with write data and write data having a size of half a memory block is written at one memory block.

In operation S230, the memory controller 510 may select one of four assigned memory blocks of the nonvolatile memory device 520.

In operation S240, the memory controller 510 may judge whether the selected memory block is fully filled with assigned write data without an extra space. When the selected memory block is fully filled with assigned write data without an extra space, the method proceeds to operation S250. When the selected memory block is not fully filled with assigned write data, the method proceeds to operation S260.

In operation S250, the memory controller 510 may control a nonvolatile memory device 520 such that write data input from an external device is programmed at the selected memory block according to a full alternate programming (FA_PGM) manner. That is, the memory controller 510 may control the nonvolatile memory device 520 such that assigned data is programmed according to an alternate programming sequence applied to all page portions (to an MSB page portion from an LSB page portion) of the selected memory block. The method may go to operation S230 to select a memory block in which the remaining data is to be programmed.

In operation S260, the memory controller 510 may control the nonvolatile memory device 520 such that the input write data is programmed at the selected memory block according to the partial alternate programming (PA_PGM) manner. In particular, the memory controller 510 may control the nonvolatile memory device 520 such that $1^{st}$ data of the input write data is programmed at a first page portion and a second page portion.

In operation S270, 2$^{nd}$ data, not programmed at operation S260, from among the write data may be sequentially programmed at a third page portion of the selected memory block. The memory controller 510 may control the nonvolatile memory device 520 to program $2^{nd}$ data of the write data at a third page portion of the selected memory block. When the second data is programmed, word lines or rows of the selected memory block may be selected not alternately, but sequentially. If the partial alternate programming (PA_PGM) operation on the selected memory block is completed, an overall program operation on the write request may be ended.

When a selected memory block is accessed according to a size of data provided form an external device at a data writing operation, it is possible to flexibly perform the partial alternate programming (PA_PGM) operation on memory blocks. For example, a memory block may be programmed in the full alternate programming (FA_PGM) manner, and another memory block may be programmed in the partial alternate programming (PA_PGM) manner.

Figure 16A:
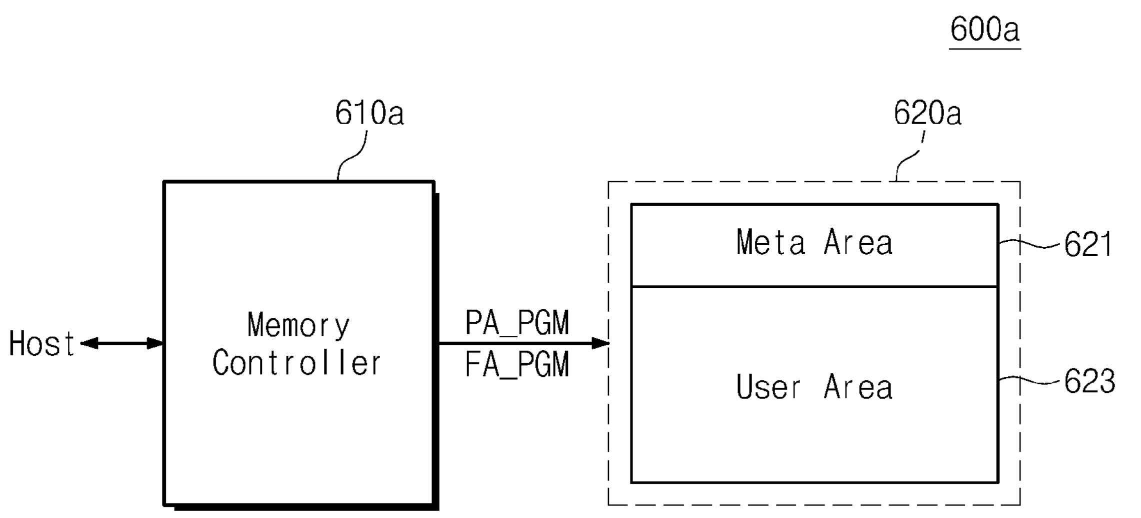
FIGS. 16A and 16B are block diagrams schematically illustrating a memory system according to other embodiments of the inventive concepts.
Figure 16B:
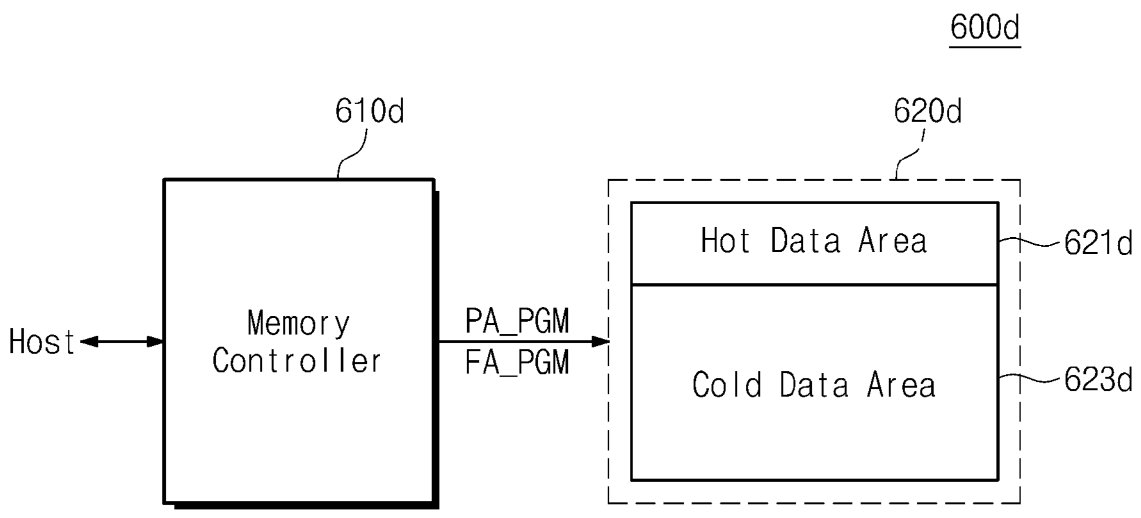

FIGS. 16A and 16B are block diagrams schematically illustrating a memory system according to other embodiments of the inventive concepts. Referring to FIG. 16A, a memory system 600*a* may include a memory controller 610*a* and a nonvolatile memory device 620*a*. Herein, the nonvolatile memory device 620*a* may be a vertical nonvolatile memory device, which includes cell strings formed in a direction perpendicular to a substrate. Alternatively, the nonvolatile memory device 620*a* may be a planar nonvolatile memory device, which includes cell strings formed in parallel with the substrate. Alternatively, the nonvolatile memory device 620*a* may be formed of a nonvolatile memory device 100 in FIG. 1 or a nonvolatile memory device 400 in FIG. 10.

The memory controller 610*a* may access the nonvolatile memory device 620*a* according to a write request from an external device (or, a host). The memory controller 610*a* may determine a programming mode according to an attribute of write-requested data. For example, the memory controller 610*a* may program highly reliable data such as metadata at a metadata area 621 in a partial alternate programming (PA_PGM) manner. When write-requested data is user data, the memory controller 610*a* may program the write-requested data at a user data area 623 in a full alternate programming (FA_PGM) manner. On the other hand, referring to FIG. 16B, the memory controller 610*a* may program frequently accessed data at a hot data area in FIG. 16C.

An attribute of write-required data is not limited to this disclosure. Control data or code data can be programmed at a selected area of the nonvolatile memory device 620 according to the partial alternate programming (PA_PGM) manner.

In addition, a manner of writing is determined to be opposite to that according to an attribute of data. For example, the memory controller 610*a* may program highly reliable data such as metadata at the metadata area 621 in the full alternate programming (FA_PGM) manner. When write-requested data is user data, the memory controller 610*a* may program the write-requested data at the user data area 623 in the partial alternate programming (PA_PGM) manner.

Figure 16C:
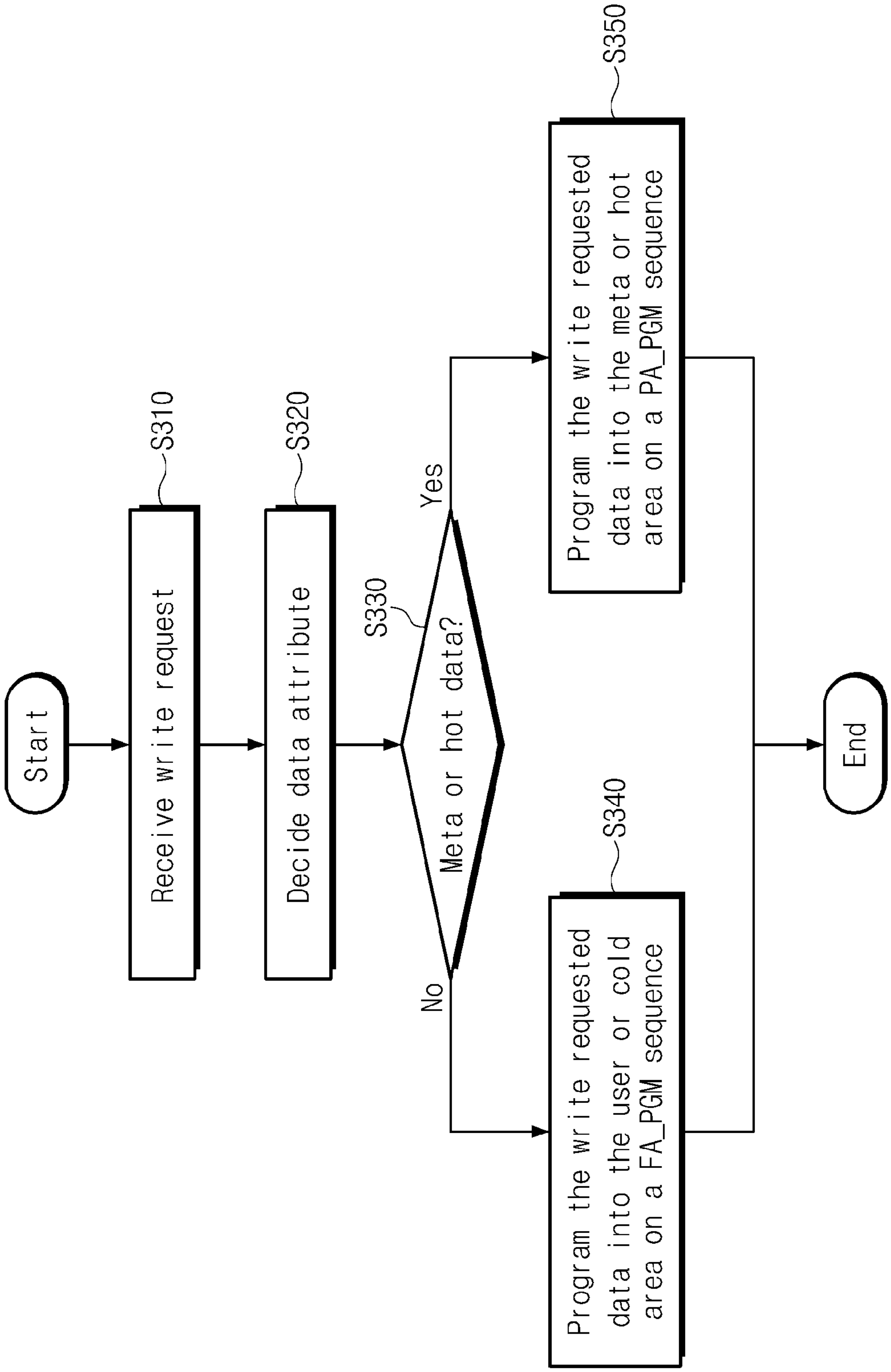
FIG. 16C is a flowchart illustrating a programming method described in FIG. 16A.

FIG. 16C is a flowchart illustrating a programming method described in FIGS. 16A and 16B. A programming method for determining a programming mode according to an attribute of write-requested data will be described with reference to FIG. 16B.

In operation S310, a write request may be received. For example, a write operation may be required from an external device, or a write operation may be required by update of code data periodically generated at a memory controller 610*a*. The memory controller 610*a* may detect the write request to prepare a write operation.

In operation S320, the memory controller 610*a* may judge an attribute of the write-requested data. Multimedia data or sound source data provided from an external device may be determined to be user data. On the other hand, code data or control information associated with the memory system 610*a* may be determined to be metadata.

In operation 5330, the method may diverge into different program procedures according to the attribute of the write-requested data. For example, when the write-requested data is user data, not metadata, the method proceeds to operation S340. When the write-requested data is metadata, the method proceeds to operation S350.

In operation S340, the memory controller 610*a* may control the nonvolatile memory device 620*a* such that the write-requested data is programmed at a memory block of the user data area 623 according to a full alternate programming manner.

In operation S350, the memory controller 610*a* may control the nonvolatile memory device 620*a* such that the write-requested data is programmed at the metadata area 621 according to a partial alternate programming manner.

When a selected memory unit is accessed according to an attribute of a data writing operation, the integrity of data may discriminate according to a high status of data.

Figure 17A:
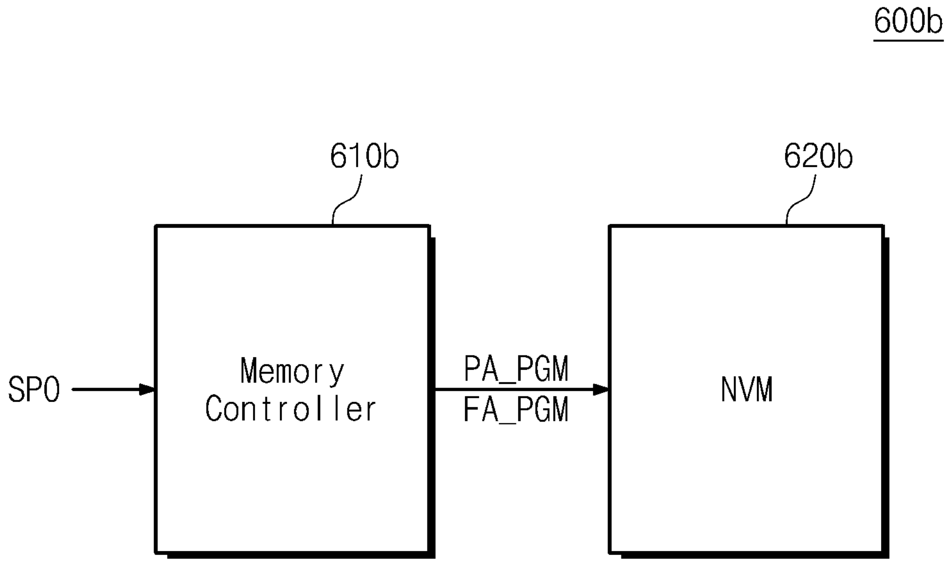
FIG. 17A is a block diagram schematically illustrating a memory system according to still another embodiment of the inventive concept.

FIG. 17A is a block diagram schematically illustrating a memory system according to still another embodiment of the inventive concept. Referring to FIG. 17A, a memory system 600*b* may include a memory controller 610*b* and a nonvolatile memory device 620*b*. Herein, the nonvolatile memory device 620*b* may be a vertical nonvolatile memory device, which includes cell strings formed in a direction perpendicular to a substrate. Alternatively, the nonvolatile memory device 620*b* may be a planar nonvolatile memory device, which includes cell strings formed in parallel with the substrate. Alternatively, the nonvolatile memory device 620*b* may be formed of a nonvolatile memory device 100 in FIG. 1 or a nonvolatile memory device 400 in FIG. 10.

The memory controller 610*b* may access the nonvolatile memory device 620*b* according to a write request from an external device (e.g., a host). The memory controller 610*b* may determine a programming mode according to a power management mode of write-requested data. For example, the memory controller 610*b* may determine a write mode of write-requested data based on a power management mode of a host associated with a sudden power-off condition (hereinafter, referred to as SPO). That is, in a case where the SPO is activated, the memory controller 610*b* may control the nonvolatile memory device 620*b* to program write-requested data in a full alternate programming (FA_PGM) manner. The full alternate programming (FA_PGM) manner may be suitable to cope with the SPO generated during a program operation. The reason is that the full alternate program operation is performed on the assumption that pages provided for programming are backed up. When the SPO is inactivated, the memory controller 610*b* may control the nonvolatile memory device 620*b* to program write-requested data in the partial alternate programming (PA_PGM) manner.

The memory controller 610*b* may control the nonvolatile memory device 620*b* to program data in the PA_PGM or FA_PGM manner based on various control information as well as a power management mode.

Figure 17B:
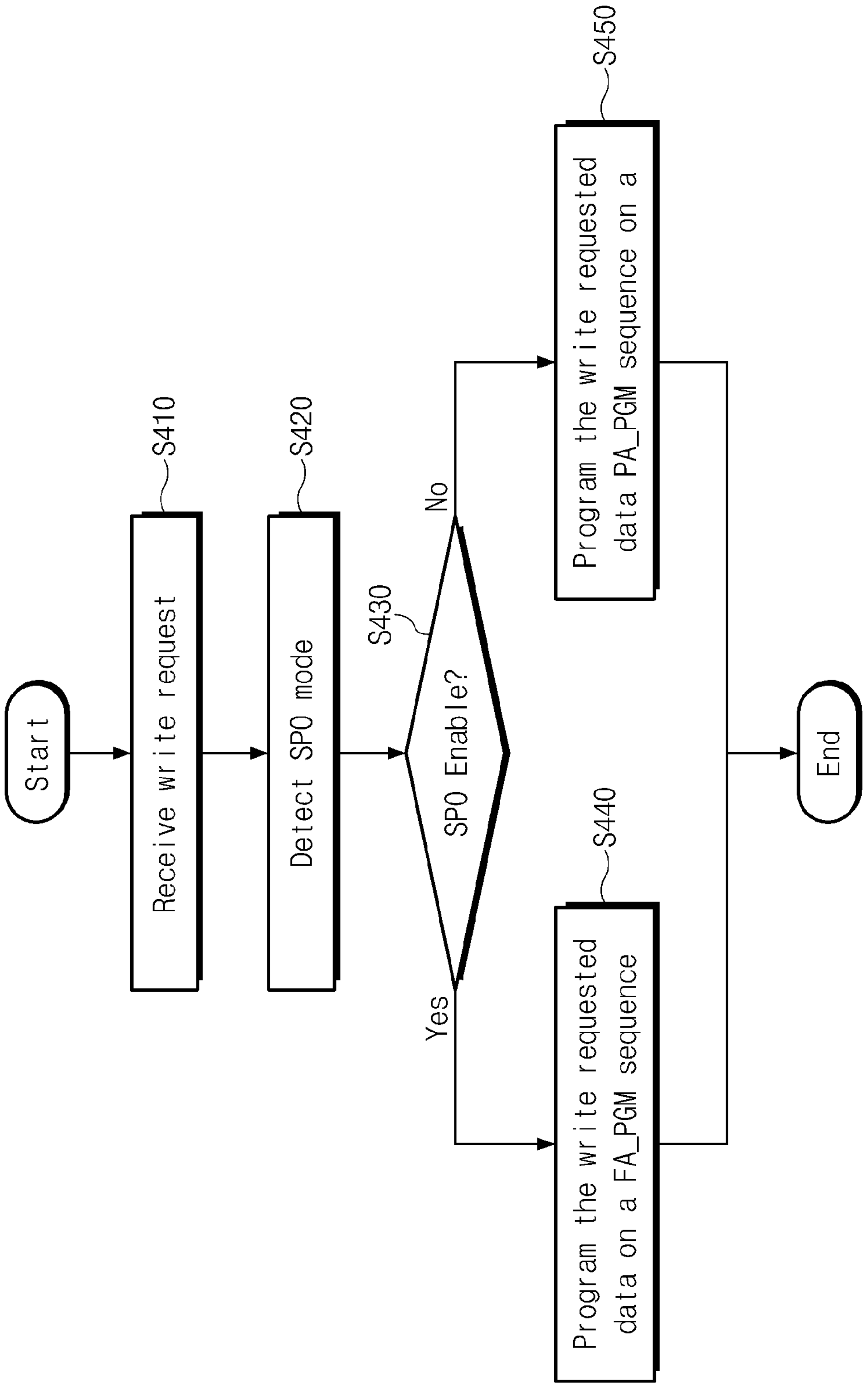
FIG. 17B is a flowchart illustrating a programming method of a memory system in FIG. 17A.

FIG. 17B is a flowchart illustrating a programming method of a memory system in FIG. 17A. A programming mode of write-requested data may be determined according to a power management mode (e.g., SPO).

In operation 5410, upon a write request of data, a memory controller 610*b* may detect the write request to prepare a write operation.

In operation 5420, the memory controller 610*b* may judge whether a power management mode SPO determined by a host is activated. Herein, the power management mode SPO may be fetched from BIOS setting of the host. Alternatively, the power management mode SPO may be fetched from a fuse array of the host.

In operation 5430, the method may diverge into different program procedures according to whether the power management mode SPO is activated. For example, when the power management mode SPO is activated, the method proceeds to operation S440, in which the memory controller 610*b* controls a nonvolatile memory device 620*b* to program write-requested data at a selected memory block according to a full alternate programming manner.

When the power management mode SPO is inactivated, the method proceeds to operation S450, in which the memory controller 610*b* controls the nonvolatile memory device 620*b* to program write-requested data at a selected memory block according to a partial alternate programming manner.

Figure 18:
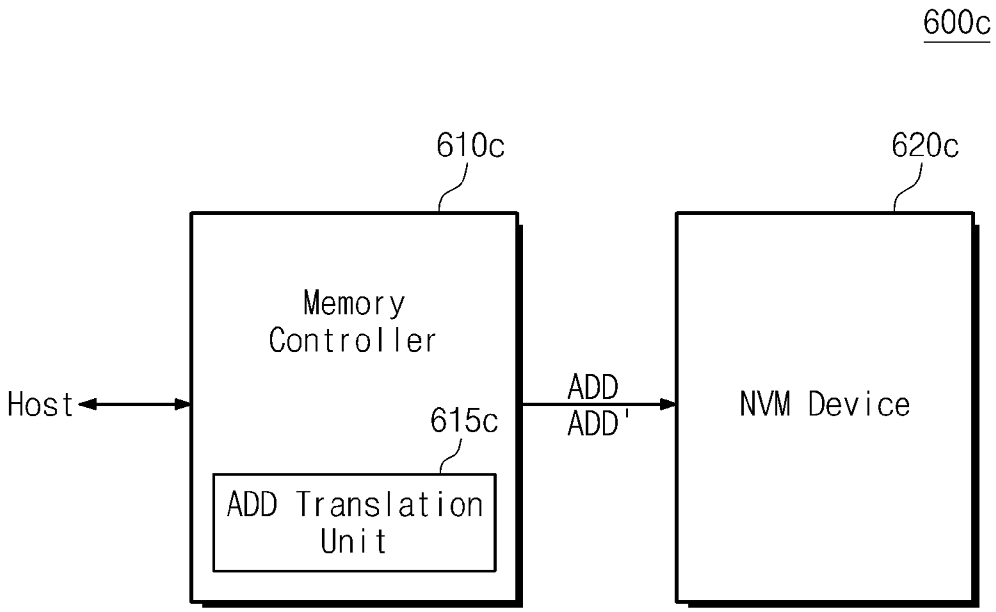
FIG. 18 is a block diagram schematically illustrating a memory system according to still another embodiment of the inventive concept.

FIG. 18 is a block diagram schematically illustrating a memory system according to still another embodiment of the inventive concept. Referring to FIG. 18, a memory system 600*c* may include a memory controller 610*c* and a nonvolatile memory device 620*c*. Herein, the nonvolatile memory device 620*c* may be a vertical nonvolatile memory device which includes cell strings formed in a direction perpendicular to a substrate. Alternatively, the nonvolatile memory device 620*c* may be a planar nonvolatile memory device which includes cell strings formed in parallel with the substrate. The nonvolatile memory device 620*c* may be a memory device which is configured to program a plurality of page portions in a full alternate programming (FA_PGM) manner.

The memory controller 610*c* may access the nonvolatile memory device 620*c* according to a write request from an external device (or, a host). When a size of write-requested data is smaller than a size of a memory block, the memory controller 610*c* may control the nonvolatile memory device 620*c* to program the write-requested data at a selected memory block in a partial alternate programming (PA_PGM) manner. When a size of write-requested data is equal to a size of a memory block, the memory controller 610*c* may control the nonvolatile memory device 620*c* to program the write-requested data at a selected memory block in a full alternate programming (FA_PGM) manner.

Compared with FIG. 10B, the memory controller 610*c* may provide the program address sequence according to determined programming mode. The memory controller 610*c* may control an address such that a selected memory block is programmed in one of the full alternate programming (FA_PGM) manner and the partial alternate programming (PA_PGM) manner. For example, the memory controller 610*c* may provide a first scrambled address ADD such that rows in the selected memory block are programmed in the full alternate programming (FA_PGM) manner. Alternatively, the memory controller 610*c* may provide a second scrambled address ADD' such that rows in the selected memory block are programmed in the partial alternate programming (PA_PGM) manner. The memory controller 610*c* may include an address translation unit 615*c*.

The address translation unit 615*c* may generate several scrambled address sets. For example, the address translation unit 615*c* may switch the first scrambled address ADD into the second scrambled address ADD' such that rows are selected in the full alternate programming (FA_PGM) manner. Alternatively, the address translation unit 615*c* may switch the second scrambled address ADD' into the first scrambled address ADD such that rows are selected in the partial alternate programming (PA_PGM) manner. The address translation unit 615*c* may be implemented using an address translation table or an algorithm such as firmware.

Herein, a programming manner of the inventive concept may be applied to a nonvolatile memory device 620*c* even in the event that the full alternate programming (FA_PGM) manner is applied to all memory blocks without a separate programming mode. The reason is that the memory controller 610*c* performs the partial alternate programming (PA_PGM) manner via a row address control scheme when it is required.

Figure 19:
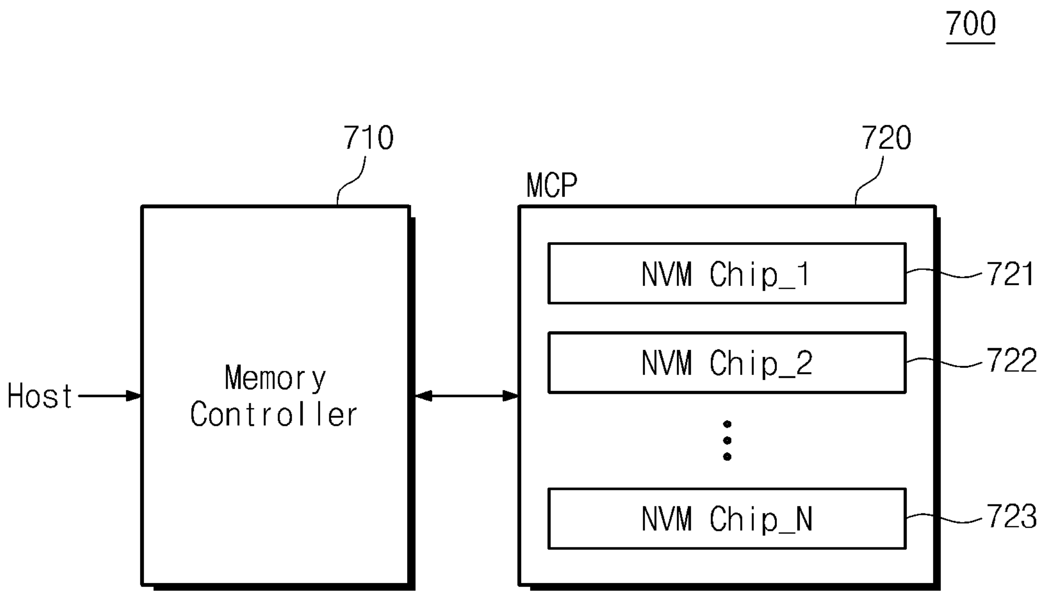
FIG. 19 is a block diagram schematically illustrating a memory system according to still another embodiment of the inventive concept.

FIG. 19 is a block diagram schematically illustrating a memory system according to still another embodiment of the inventive concept. Referring to FIG. 19, a memory system 700 may include a memory controller 710 and a nonvolatile memory device 720 formed of a multi-chip package.

The nonvolatile memory device 720 may include a plurality of nonvolatile memory chips 721 to 723, each of which has multi-level cells each storing three or more bits of data. Each of plurality of nonvolatile memory chips 721 to 723 may include a plurality of memory blocks each having cell strings formed in a direction perpendicular to or parallel with a substrate.

The memory controller 710 may assign write-requested data to the plurality of nonvolatile memory chips 721 to 723. When a size of write-requested data is smaller than a size of a nonvolatile memory chip, the memory controller 710 may adopt a partial alternate programming (PA_PGM) manner of the inventive concept. When a size of write-requested data is equal to a size of a nonvolatile memory chip, a selected nonvolatile memory chip may be programmed according to a full alternate programming (FA_PGM) manner of the inventive concept.

FIG. 20 is a table illustrating a partial alternate programming method of a nonvolatile memory chip in FIG. 19. Referring to FIG. 20, data may be programmed at each memory block of a selected nonvolatile memory chip NVM Chip_i (i=1, 2, . . . , 3) according to a partial alternate programming (PA_PGM) manner.

Thirty-two (32) pages of data (0 to 31) may be written at each of memory blocks of the selected nonvolatile memory chip NVM Chip_i in an alternate programming manner. At this time, the alternate programming manner may be applied to a first page portion (or, an LSB page) and a second page portion other than a third page portion (or, an MSB page). Thirty-two (32) pages of data may be alternately written at the first and second page portions.

After 32 pages of data are alternately written at the first and second page portions of a memory block, the remaining write data (32 to 38) may be written at third page portions (or, MSB pages) sequentially. That is, the remaining write data (32 to 38) may be programmed at the third page portions, with word lines selected sequentially, not alternately. The remaining write data (32 to 38) may be programmed at the third page portions of the selected memory block based on a programming sequence: WL<0>→WL<1>→WL<2>→WL<3>→WL<4>→WL<5>→WL<6>.

With the inventive concept, a partial alternate programming manner may be applied by a nonvolatile memory chip unit.

Figure 21:
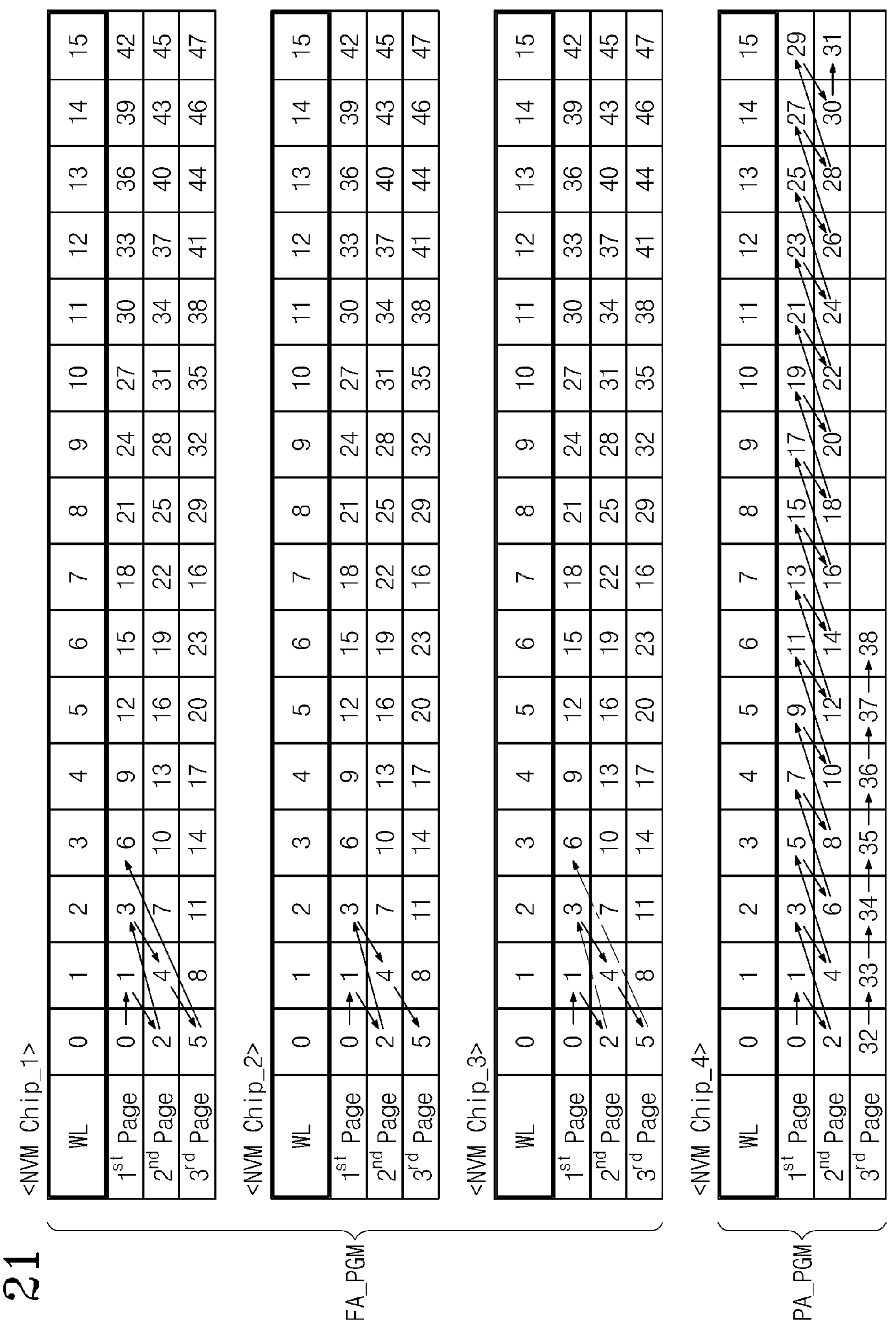
FIG. 21 shows tables illustrating the cases for programming data at a plurality of chips.

FIG. 21 shows tables illustrating the cases for programming data at a plurality of chips. Data may be programmed at nonvolatile memory chips NVM Chip_1, NVM Chip_2, and NVM Chip_3 according to a full alternate programming (FA_PGM) manner. On the other hand, a partial alternate programming (PA_PGM) manner may be applied to a nonvolatile memory chip NVM Chip_4, which includes page portions not filled with data.

Figure 22:
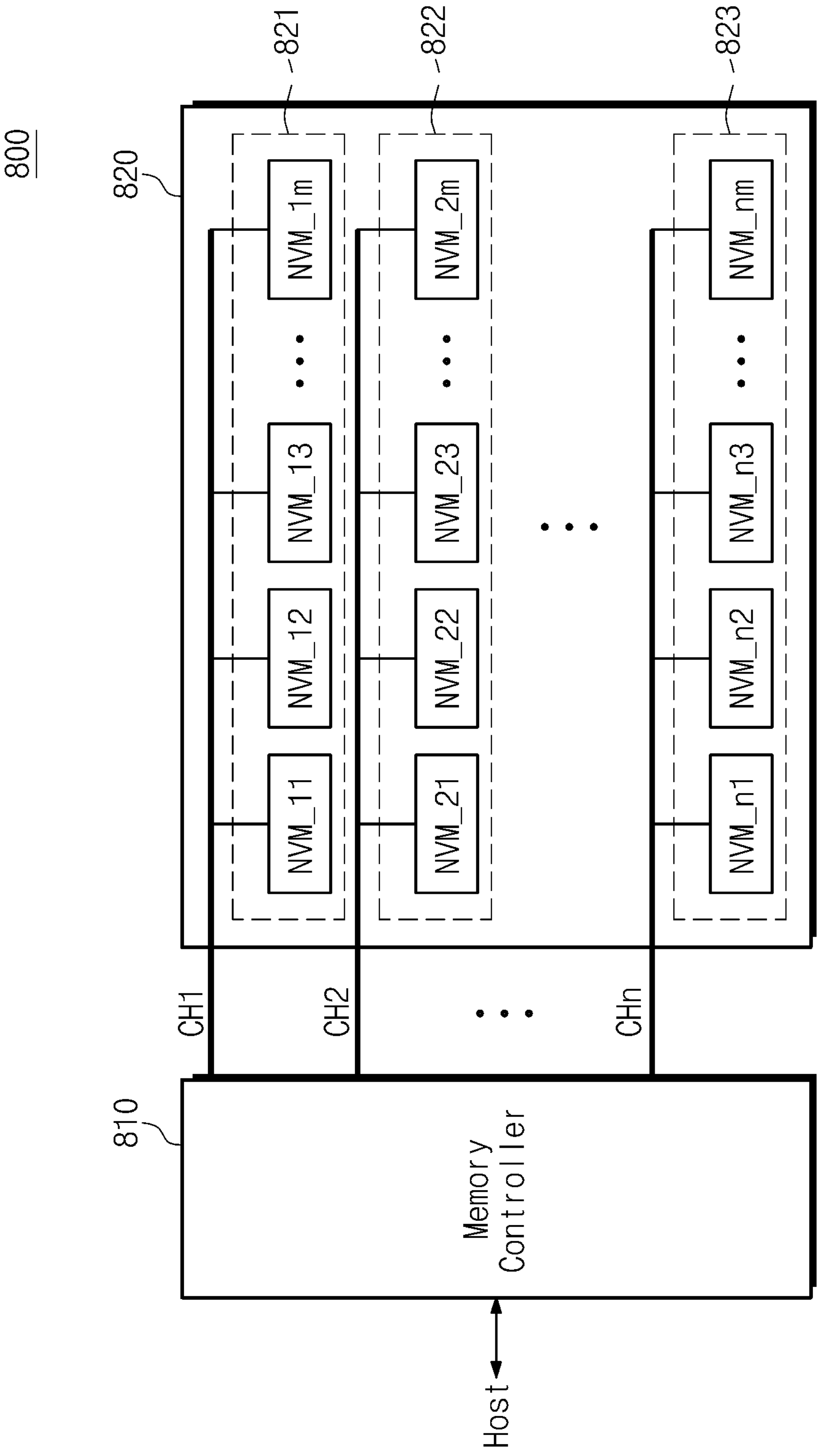
FIG. 22 is a block diagram schematically illustrating a nonvolatile memory device formed of a multi-chip package according to still another embodiment of the inventive concept.

FIG. 22 is a block diagram schematically illustrating a nonvolatile memory device formed of a multi-chip package according to still another embodiment of the inventive concept. Referring to FIG. 22, a memory system 800 a memory controller 810 and a nonvolatile memory device 820 formed of a multi-chip package. The nonvolatile memory device 820 may exchange data with the memory controller 810 via a plurality of channels CH1 to CHn.

An input/output port (e.g., an 8-bit I/O port) of each of a plurality of, for example, m memory devices (NVM_11 to NVM_1*m*) 821 may be connected with a first channel CH1. The remaining channels CH2 to CHn may be connected with memory devices 822 to 823 in the same manner as described with reference to the first channel CH1.

When data is programmed at the nonvolatile memory device 820, the memory controller 810 may determine whether or not to apply a partial alternate programming (PA_PGM) manner by a channel unit and a way unit. Herein, the term "way" may be used to indicate the number of memory devices simultaneously selected at respective channels. That is, memory blocks of nonvolatile memory devices selected by a channel and way unit may constitute a super block. For example, memory blocks simultaneously selected from a memory device NVM_11 connected to the first channel CH1 and a memory device NVM_21 connected to the second channel CH2 may constitute a super block. In this case, a partial alternate programming (PA_PGM) operation of the inventive concept may be performed by a super block unit.

FIGS. 23A to 23D are diagrams illustrating various partial alternate programming manners of the inventive concept.

Figure 23A:
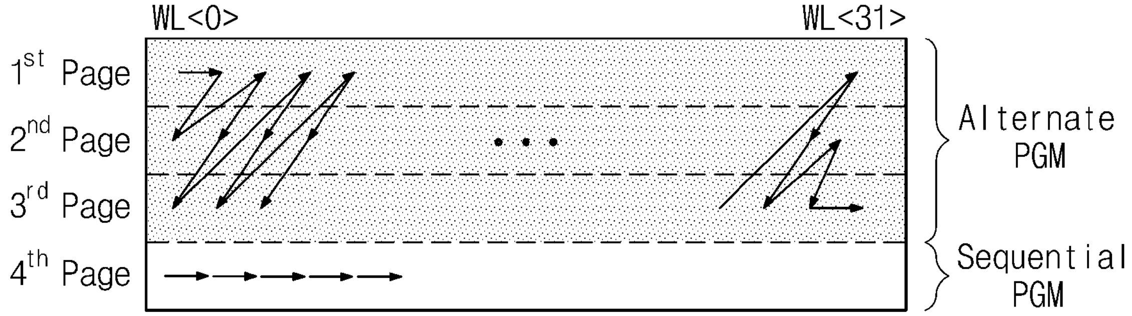
FIGS. 23A to 23D are diagrams illustrating various partial alternate programming manners of the inventive concept.

Referring to FIG. 23A, a partial alternate programming (PA_PGM) manner is applied to a 4-bit multi-level cell (MLC). An alternate programming manner may be applied to first to third page portions $1^{st}$ page to $3^{rd}$ page of a memory block. On the other hand, data may be sequentially programmed at fourth page portions corresponding to MSB pages according to a word line order.

Figure 23B:
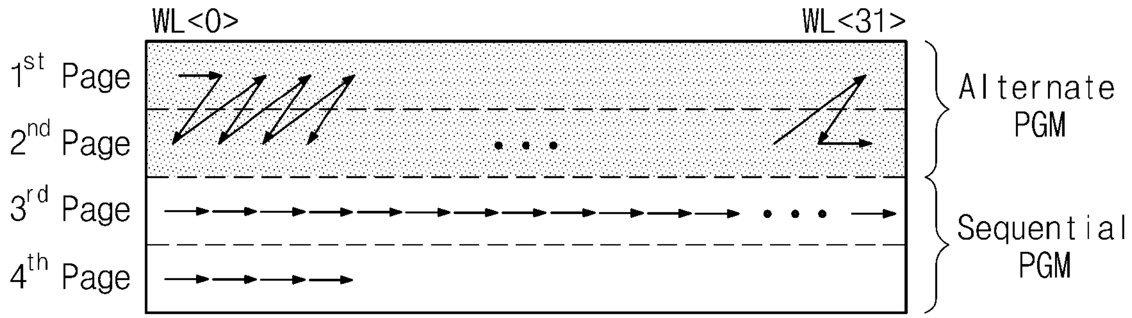

Referring to FIG. 23B, a partial alternate programming (PA_PGM) manner is applied to a 4-bit multi-level cell (MLC). An alternate programming manner may be applied to first and second page portions of a memory block. On the other hand, data may be sequentially programmed at third and fourth page portions according to a word line order.

Figure 23C:
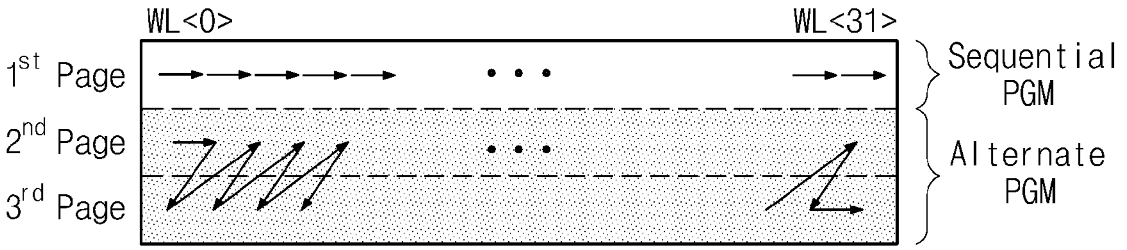

Referring to FIG. 23C, a partial alternate programming (PA_PGM) manner is applied to a 3-bit multi-level cell (MLC). However, the partial alternate programming (PA_PGM) manner in FIG. 23C is applicable to a 4-bit multi-level cell (MLC). With the partial alternate programming (PA_PGM) manner in FIG. 23C, data may be sequentially programmed at first page portions of a memory block according to a word line order. On the other hand, an alternate programming manner may be applied to second and third page portions $2^{nd}$ page and $3^{rd}$ page.

Figure 23D:
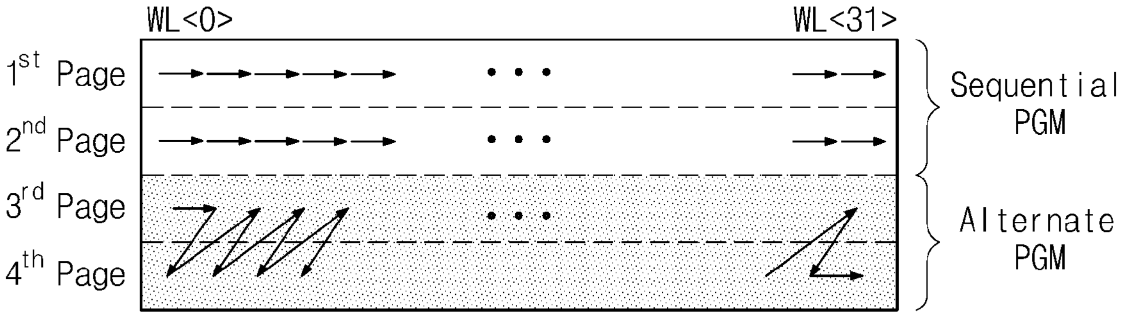

Referring to FIG. 23D, a partial alternate programming (PA_PGM) manner is applied to a 4-bit multi-level cell (MLC). With the partial alternate programming (PA_PGM) manner in FIG. 23D, data may be sequentially programmed at first and second page portions of a memory block according to a word line order. On the other hand, an alternate programming manner may be applied to third and fourth page portions.

A part of various embodiments of the partial alternate programming (PA_PGM) manner of the inventive concept may be illustrated in FIGS. 23A to 23D. It is possible to program a memory block formed of multi-level cells using both a sequential programming manner and an alternate programming manner.

Figure 24B:
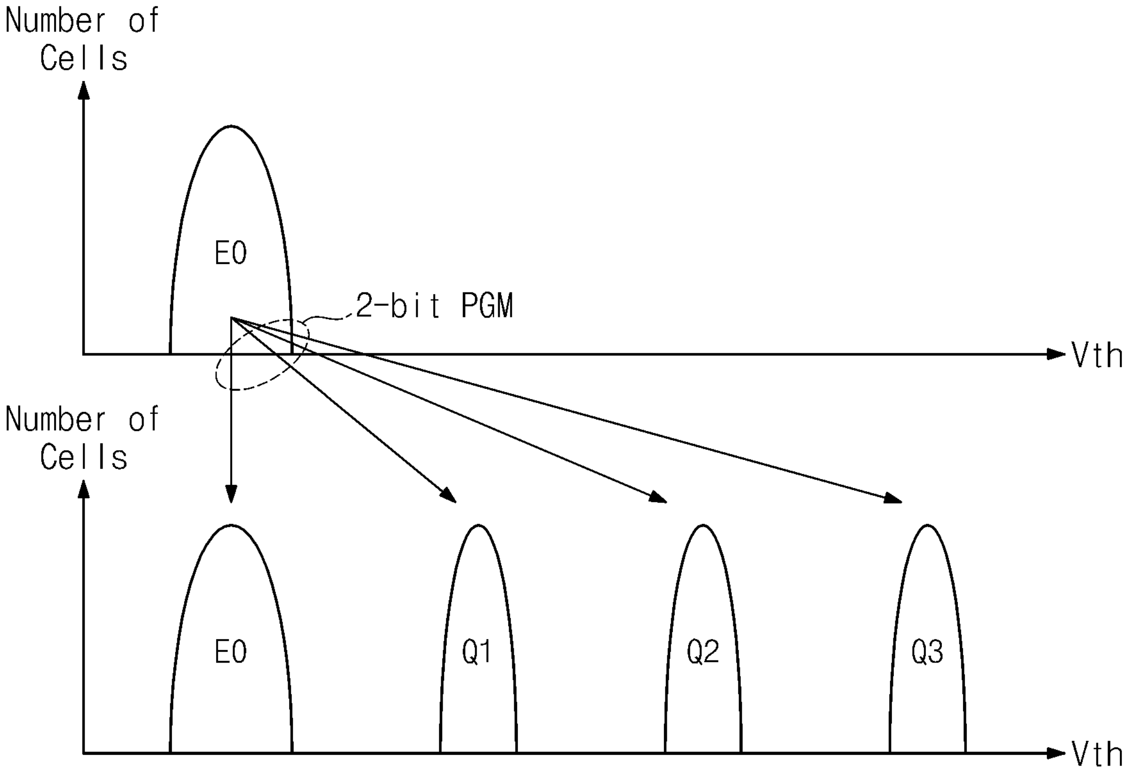
Figure 24C:
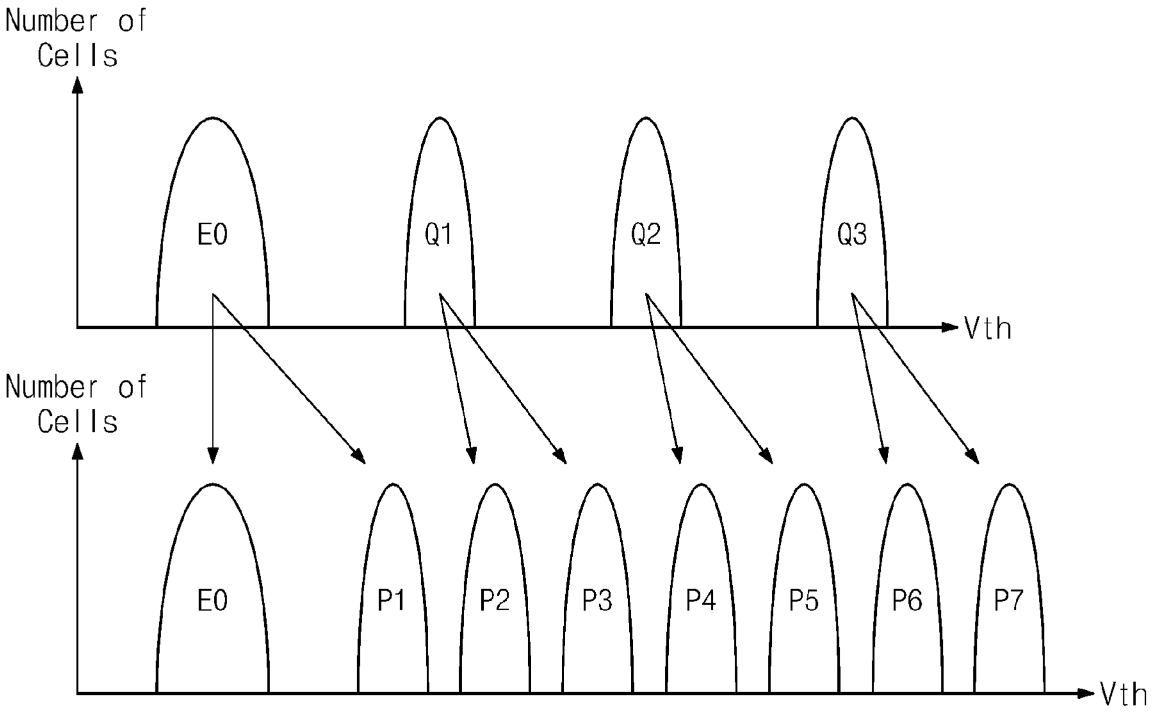

FIGS. 24A to 24C are diagrams illustrating programming methods according to still other embodiments of the inventive concept. In FIG. 24A, two page portions are programmed by a program procedure. It is assumed that a memory block (or, a sub block) includes memory cells connected with 16 word lines WL<0> to WL<15>. Further, it is assumed that data to be programmed at a memory block is formed of 39 pages (e.g., 39×4 Kbyte/page).

Thirty-two (32) pages of data (0 to 31) may be programmed at first and second page portions. Herein, two pages of data (0, 1) may be simultaneously programmed at first and second page portions corresponding to the word line WL<0>. That is, two-bit data may be programmed at selected memory cells at a program period of operation. Likewise, two pages of data (2, 3) may be simultaneously programmed at first and second page portions corresponding to the word line WL<1>. First and second page portions corresponding to the word lines WL<0> to WL<15> may be programmed in the above-described 2-bit programming manner.

After the first and second page portions are programmed, the remaining pages of data (32 to 38) may be sequentially programmed at third page portions according to a word line order.

The number of memory cells the MSB page portions of which are filled may be reduced by programming data according to the above-described programming manner. That is, in the event that 39 pages of data are programmed at a 3-bit MLC memory block having a 48-page size, if the programming method of the inventive concept is applied, the third page portions of memory cells corresponding to nine rows WL<7> to WL<15> may be empty. Thus, the chance that three page portions are all programmed may be remarkably reduced. That is, the program disturbance may be remarkably reduced.

The inventive concept is described under the condition that first and second page portions are simultaneously programmed with 2-bit data. However, the inventive concept is not limited thereto. That is, first page portions $1^{st}$ page may be sequentially programmed, and 2-bit data may be programmed at second and third page portions $2^{nd}$ page and $3^{rd}$ page. The inventive concept is described using a 3-bit multi-level cell (MLC). However, the inventive concept may be applied to a multi-level cell storing four or more bits of data. That is, the number of bits being simultaneously programmed may be over 3. A location of a page portion to which a sequential programming manner is applied may be changed variously from an LSB page to an MSB page.

FIGS. 24B and 24C are diagrams illustrating 1-bit program procedures applied at a 2-bit concurrent program operation and a sequential program operation. In FIG. 24B, there is illustrated a 2-bit programming method applied to a first page portion and a second page portion illustrated in FIG. 24A. Referring to FIG. 24B, memory cells may be programmed to one of four states E0, Q1, Q2, and Q3 from an erase state E0 according to a 2-bit programming manner.

In FIG. 24C, there is illustrated a 1-bit programming method applied to a third page portion illustrated in FIG. 24A. Referring to FIG. 24C, as memory cells are sequentially programmed by a bit unit, memory cells may be programmed to one of four states E0, P1, P2, P3, P4, P5, P6, and P7 from four states E0, Q1, Q2, and Q3.

FIGS. 25A to 25D are diagrams illustrating the cases in which a partial alternate programming manner is applied to a multi-level cell nonvolatile memory device. For ease of description, the inventive concept will be described under the condition that 328 pages of data are stored at four memory blocks BLK0 to BLK3 formed of 3-bit multi-level cells.

Figure 25A:
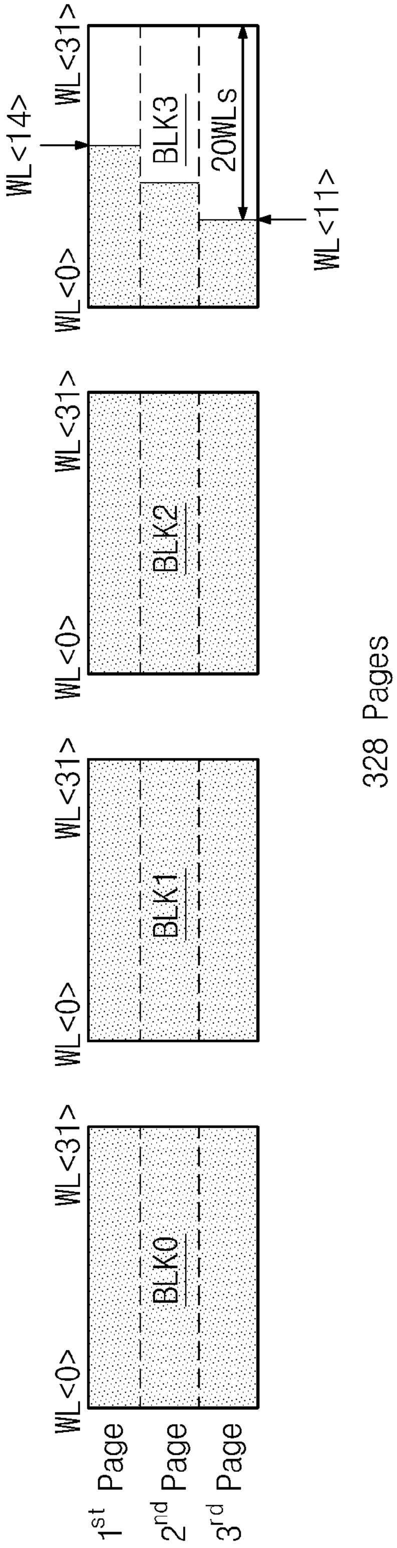
FIGS. 25A and 25D are diagrams illustrating the cases in which a partial alternate programming manner is applied to a multi-level cell nonvolatile memory device.

In FIG. 25A, there is illustrated the case that 328 pages of data are stored at four memory blocks BLK0 to BLK3 in a full alternate programming (FA_PGM) manner. First, 288 pages of data are stored at three memory blocks BLK0 to BLK2 in the full alternate programming (FA_PGM) manner. Fifty-six (56) pages of data may be programmed at the remaining memory block BLK3 in the full alternate programming (FA_PGM) manner in which word lines are selected in turn. In this case, a program operation may be performed up to a first page portion of memory cells corresponding to a word line WL<14>, up to a second page portion of memory cells corresponding to a word line WL<13>, and up to a third page portion of memory cells corresponding to a word line WL<11>.

In the event that 328 pages of data are stored at four memory blocks BLK0 to BLK3 in the full alternate programming (FA_PGM) manner, the uppermost pages of memory cells corresponding to 20 word lines in the memory block BLK3 may be excluded from a target to be programmed.

Figure 25B:
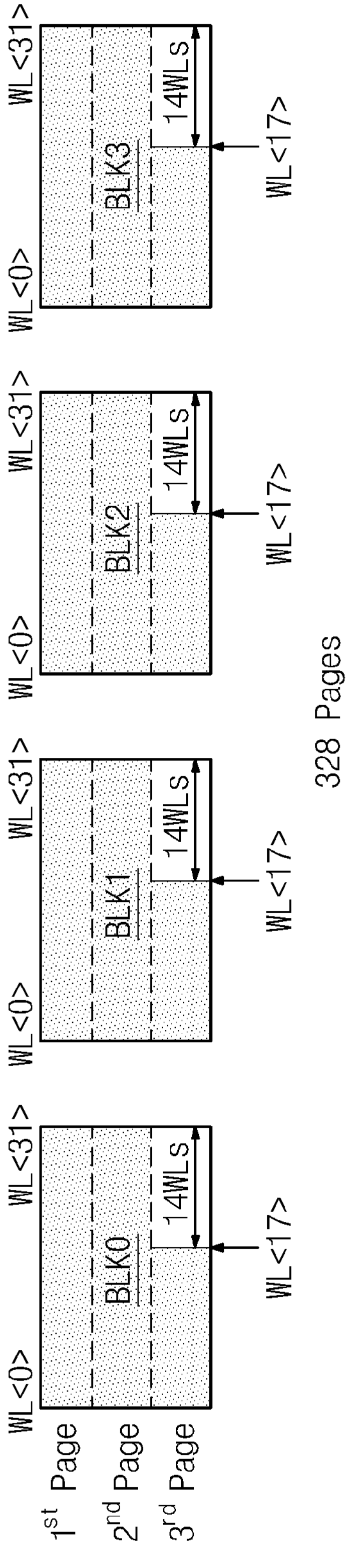

In FIG. 25B, there is illustrated the case that 328 pages of data are stored at four memory blocks BLK0 to BLK3 in a partial alternate programming (PA_PGM) manner. Two hundred sixty-five (265) pages of data may be alternately programmed at the four memory blocks BLK0 to BLK3 in an alternate programming manner. The remaining 72 pages of data may be divided into groups of 18 pages of data corresponding to the memory blocks BLK0 to BLK3, respectively, and then each group of 18 pages of data may be sequentially programmed at third pages of a corresponding memory block. By the above procedure, 328 pages of data may be stored at the four memory blocks BLK0 to BLK3 in the partial alternate programming (PA_PGM) manner. In this case, the uppermost pages of memory cells corresponding to 14 word lines in each memory block may be excluded from a target to be programmed. That is, a total of 56 rows may be excluded from a target to be programmed.

Figure 25C:
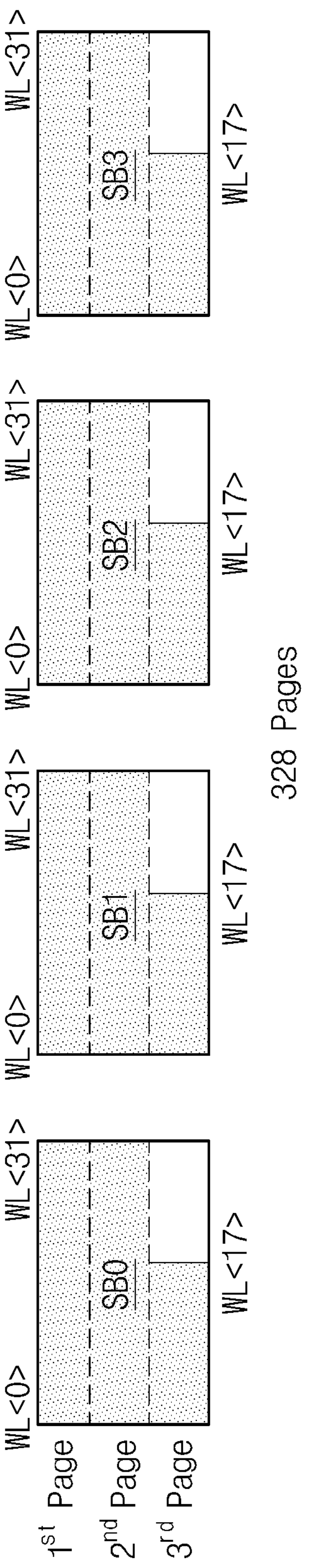

In FIG. 25C, 328 pages of data are stored at four memory sub-blocks SB0 to SB3 of a memory block BLKi in a partial alternate programming (PA_PGM) manner. Two hundred sixty-five (265) pages of data may be alternately programmed at the four memory sub-blocks SB0 to SB3 in an alternate programming manner. The remaining 72 pages of data may be divided into groups of 18 pages of data corresponding to the memory sub-blocks SB0 to SB3, respectively, and then each group of 18 pages of data may be sequentially programmed at third pages of a corresponding memory sub-block.

Figure 25D:
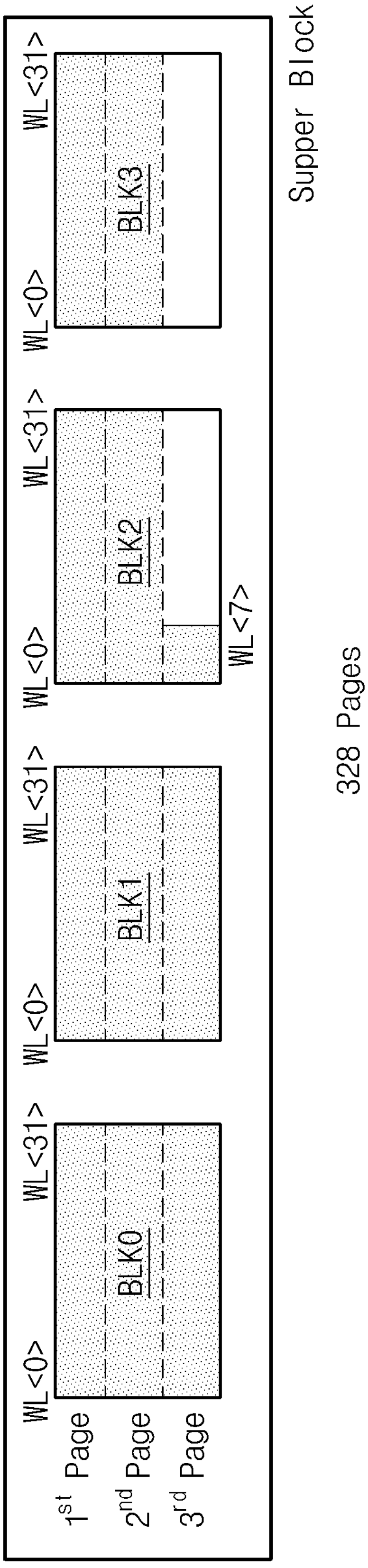

In FIG. 25D, 328 pages of data are stored at a super block including four memory blocks BLK0 to BLK3 in a partial alternate programming (PA_PGM) manner. Two hundred sixty-five (265) pages of data may be alternately programmed at the four memory blocks BLK0 to BLK3 in the superblock in an alternate programming manner. The remaining 72 pages of data may be sequentially programmed from the third page of the first word line WL<0> of the memory block BLK0 to the third page of the $8^{th}$ word line WL<7> of the memory block BLK2.

It is assumed that the same capacity of data (e.g., 328 pages of data) is programmed at four memory blocks BLK0 to BLK3. If the partial alternate programming manner is used under the assumption, compared with that when the full alternate programming manner is used, the number of rows including the uppermost pages excluded from a target to be programmed may increase (e.g., by 36 rows). Thus, when the partial alternate programming manner is used, more advantages may be obtained in terms of the program disturbance or a life of a memory device.

When a size of write data provided from an external device is smaller than a size of a memory block, the write data may be programmed at a selected memory block in the partial alternate programming (PA_PGM) manner. When a size of write data provided from an external device is equal to a size of a memory block, a memory controller 510 may program it at a selected memory block in the full alternate programming (FA_PGM) manner.

When a size of write data provided from an external device corresponds to a size of a plurality of memory blocks, the memory controller 510 may program write data at a part of selected memory blocks in the full alternate programming (FA_PGM) manner and the write data at the remaining one, not filled with data, from among the selected memory blocks in the partial alternate programming (PA_PGM) manner.

If write data having a size corresponding to 3 and a half memory blocks is input, the memory controller 510 may program write data corresponding to a size of three memory blocks according to the full alternate programming manner and write data corresponding to a size of half a memory block according to the partial alternate programming manner. This programming method may include both a merit of the partial alternate programming (PA_PGM) and a merit of the full alternate programming (FA_PGM) manner.

Herein, a programming manner of the inventive concept may be applied to a nonvolatile memory device 520 even in the event that the full alternate programming (FA_PGM) manner is applied to all memory blocks without a separate programming mode. The reason is that the memory controller 510 performs the partial alternate programming (PA_PGM) manner via a row address control scheme when it is required.

In the event that the same capacity of data is programmed, the number of rows including filled MSB page portions (e.g., $3^{rd}$ pages) in a memory block programmed according to the full alternate programming (FA_PGM) manner may increase relatively. That is, when a program operation is performed according to the full alternate programming (FA_PGM) manner, third page portions of memory cells corresponding to four word lines WL<12> to WL<15> may be empty. On the other hand, as illustrated in FIG. 7, third page portions of memory cells corresponding to nine word lines WL<7> to WL<15> may be empty. The program disturbance when the partial alternate programming (PA_PGM) manner is used may decrease compared with that when the full alternate programming (FA_PGM) manner is used.

As described above, it is possible to reduce the program disturbance and deterioration of memory cells by minimizing the number of memory cells programmed to the uppermost state. Thus, the integrity of data stored at a nonvolatile memory device may be improved.

Figure 26:
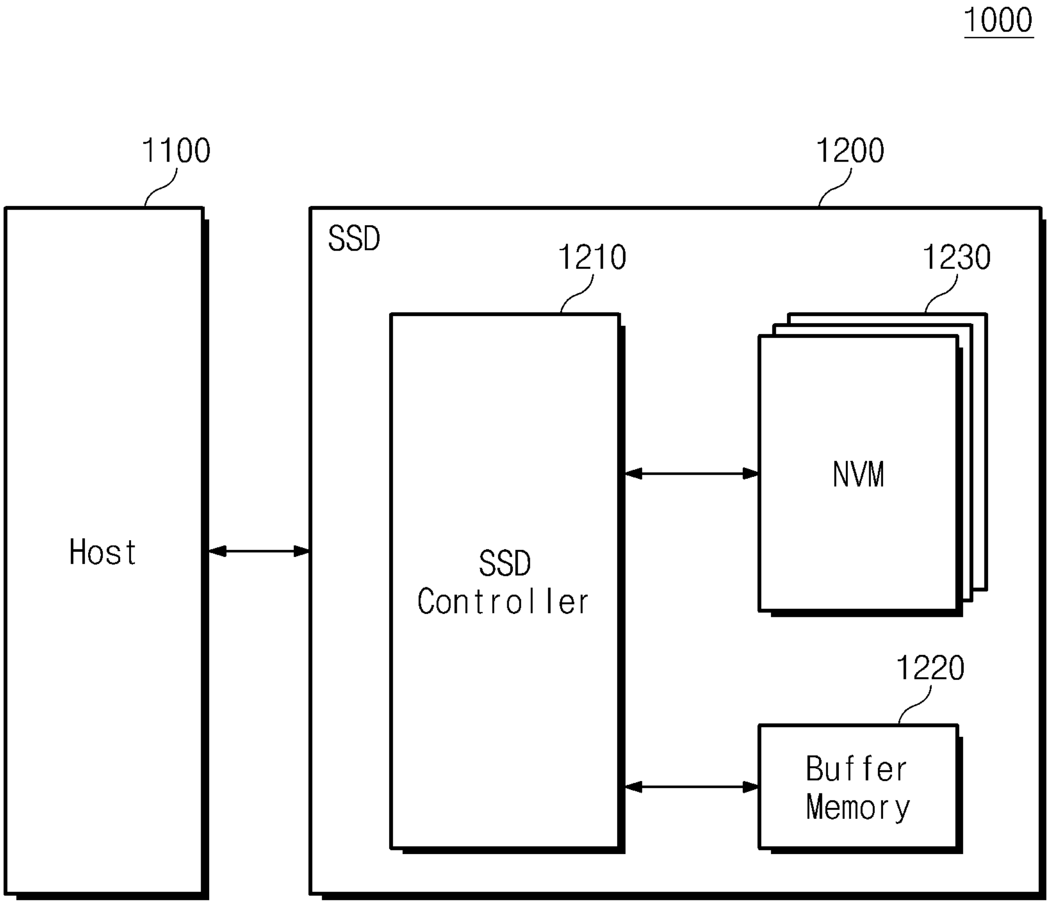
FIG. 26 is a block diagram illustrating a user device including a solid state drive according to an embodiment of the inventive concept.

FIG. 26 is a block diagram illustrating a user device including a solid state drive according to an embodiment of the inventive concept. Referring to FIG. 26, a user device 1000 may include a host 1100 and a solid state drive (hereinafter, referred to as SSD) 1200. The SSD 1200 may include an SSD controller 1210, a buffer memory 1220, and a nonvolatile memory device 1230.

The SSD controller 1210 may provide physical interconnection between the host 1100 and the SSD 1200. The SSD controller 1210 may provide an interface with the SSD 1200 corresponding to a bus format of the host 1100. In particular, the SSD controller 1210 may decode a command provided from the host 1100. The SSD controller 1210 may access the nonvolatile memory device 1230 according to the decoding result. The bus format of the host 1100 may include USB (Universal Serial Bus), SCSI (Small Computer System Interface), PCI express, ATA, PATA (Parallel ATA), SATA (Serial ATA), SAS (Serial Attached SCSI), and the like.

The buffer memory 1220 may temporarily store write data provided from the host 1100 or data read out from the nonvolatile memory device 1230. In the event that data existing in the nonvolatile memory device 1230 is cached at a read request of the host 1100, the buffer memory 1220 may support a cache function of providing cached data directly to the host 1100. Typically, a data transfer speed of a bus format (e.g., SATA or SAS) of the host 1100 may be higher than that of a memory channel of the SSD 1200. That is, in the event that an interface speed of the host 1100 is remarkably fast, lowering of the performance due to a speed difference may be reduced by providing the buffer memory 1220 having a large storage capacity.

The buffer memory 1220 may be formed of a synchronous DRAM to provide sufficient buffering to the SSD 1200 used as an auxiliary mass storage device. However, the buffer memory 1220 is not limited to this disclosure.

The nonvolatile memory device 1230 may be provided as a storage medium of the SSD 1200. For example, the nonvolatile memory device 1230 may be formed of a vertical NAND flash memory device having a mass storage capacity. The nonvolatile memory device 1230 may be formed of a plurality of memory devices. In this case, memory devices may be connected to the SSD controller 1210 by a channel unit. As a storage medium, the nonvolatile memory device 1230 may be formed of a NAND flash memory. However, the nonvolatile memory device 1230 is not limited to a NAND flash memory device. For example, a storage medium of the SSD 1200 can be formed of a PRAM, an MRAM, a ReRAM, a FRAM, a NOR flash memory, and the like. Further, the inventive concept may be applied to a memory system, which uses different types of memory devices together. The nonvolatile memory device 1230 may be configured substantially the same as described in FIG. 1.

In the SSD 1200, the nonvolatile memory device 1230 may operate substantially the same as a nonvolatile memory device in FIG. 1. That is, the nonvolatile memory device 1230 may be configured to program data with a selected memory unit (or, area or space) using a partial alternate programming (PA_PGM) manner. Thus, the nonvolatile memory device 1230 may provide the high integrity of data.

Figure 27:
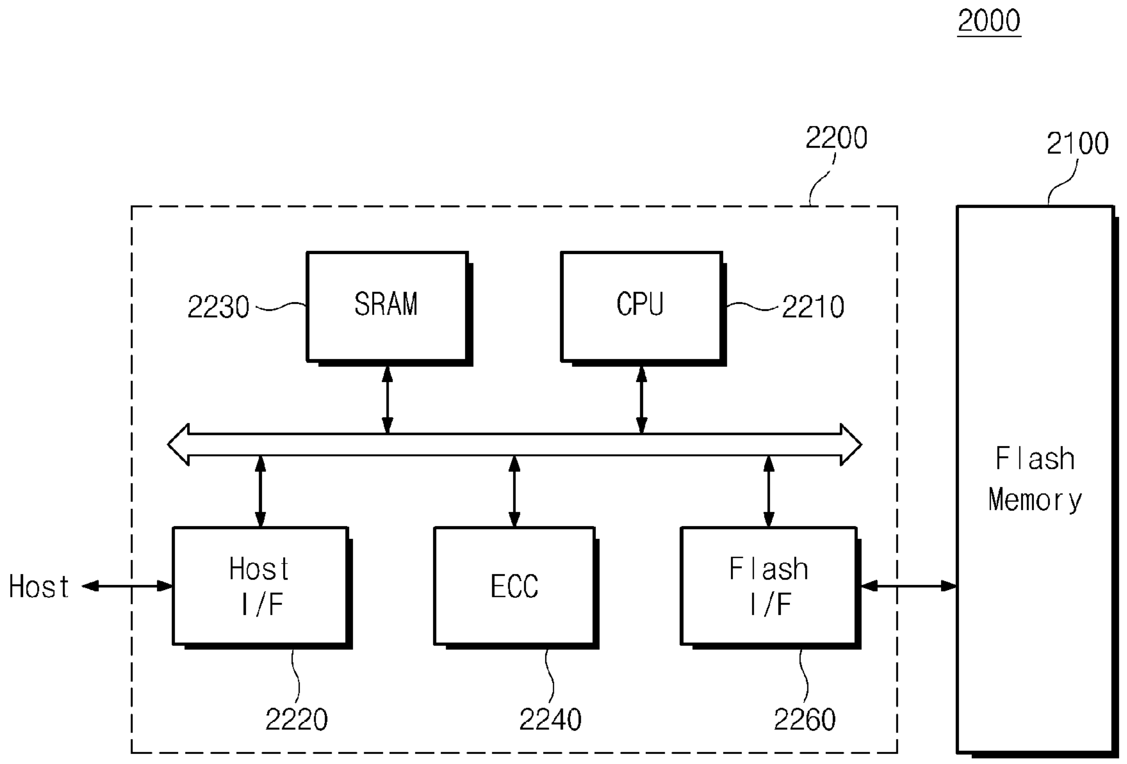
FIG. 27 is a block diagram illustrating a memory system according to another embodiment of the inventive concept.

FIG. 27 is a block diagram illustrating a memory system according to another embodiment of the inventive concept. Referring to FIG. 27, a memory system 2000 may include a nonvolatile memory 2100 and a memory controller 2200.

The nonvolatile memory 2100 may be configured substantially the same as described in FIG. 1 or 10, and description thereof is thus omitted.

The memory controller 2200 may be configured to control the nonvolatile memory 2100. An SRAM 2230 may be used as a working memory of a CPU 2210. A host interface 2220 may include a data exchange protocol of a host connected with the memory system 2000. An ECC block 2240 may be configured to detect and correct errors included in data read out from the nonvolatile memory 2100.

A memory interface 2260 may interface with the nonvolatile memory 2100 according to an embodiment of the inventive concept. The CPU 2210 may execute an overall control operation for data exchange of the memory controller 2200. Although not shown in FIG. 27, the memory system 2000 may further include ROM, which stores code data for interfacing with the host.

The memory controller 2200 may communicate with an external device (e.g., host) via one of interface protocols such as USB, MMC, PCI-E, SAS, SATA, PATA, SCSI, ESDI, IDE, and the like.

In the memory system 2000, the nonvolatile memory device 2100 may operate substantially the same as a nonvolatile memory device in FIG. 1. That is, the nonvolatile memory device 2100 may be configured to program data with a selected memory unit (or, area or space) using a partial alternate programming (PA_PGM) manner. Thus, the nonvolatile memory device 2100 may provide the high integrity of data.

In example embodiments, the memory system 2000 may be used as computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting a home network, one of various electronic devices constituting a computer network, one of various electronic devices constituting a telematics network, an RFID, and/or one of various electronic devices constituting a computing system.

Figure 28:
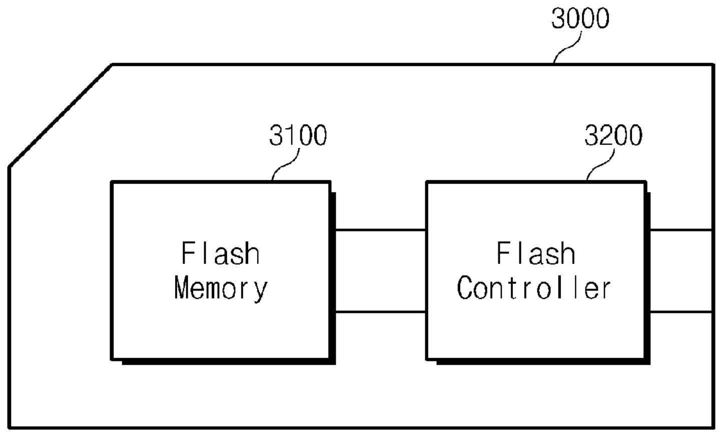
FIG. 28 is a block diagram illustrating a data storage device according to still another embodiment of the inventive concept.

FIG. 28 is a block diagram illustrating a data storage device according to still another embodiment of the inventive concept. Referring to FIG. 28, a data storage device 3000 may include a flash memory 3100 and a flash controller 3200. The flash controller 3200 may control the flash memory 3100 in response to control signals input from the outside of the data storage device 3000.

In the data storage device 3000, the flash memory 3100 may operate substantially the same as a nonvolatile memory device in FIG. 1. That is, the flash memory 3100 may be configured to program data with a selected memory unit (or, area or space) using a partial alternate programming (PA_PGM) manner. Thus, the flash memory 3100 may provide the high integrity of data.

The flash controller 3200 may provide an interface between an external device and the flash memory 3100. The data storage device 3000 may be a memory card device, an SSD device, a multimedia card device, an SD device, a memory stick device, a HDD device, a hybrid drive device, or an USB flash device. For example, the data storage device 3000 may be a card, which satisfies a standard for using a user device such as a digital camera, a personal computer, and the like.

Figure 29:
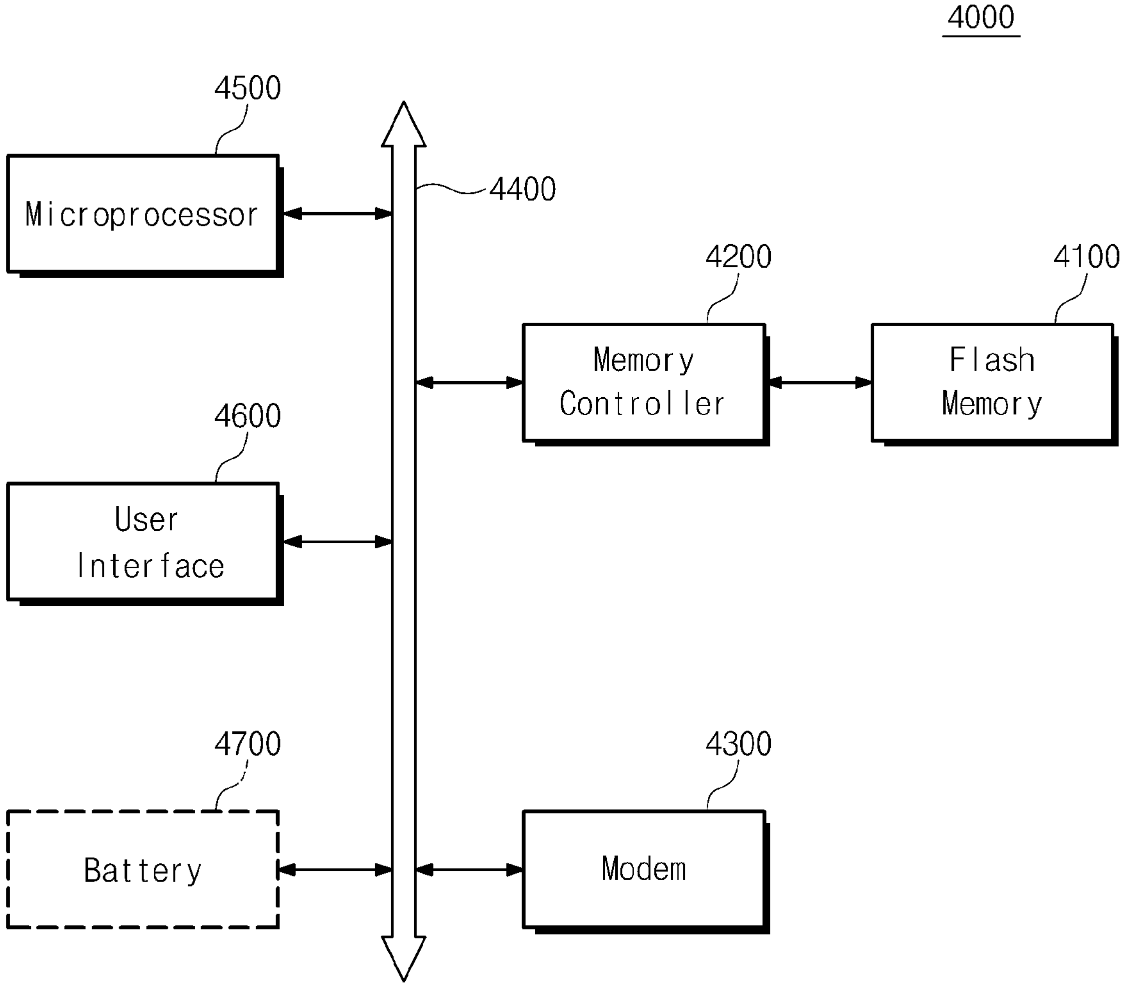
FIG. 29 is a block diagram illustrating a computing system including a flash memory device according to an embodiment of the inventive concept.

FIG. 29 is a block diagram illustrating a computing system including a flash memory device according to an embodiment of the inventive concept. A computing system 4000 may include a flash memory device 4100, a memory controller 4200, a modem 4300 such as a baseband chipset, a microprocessor 4500, and a user interface 4600. The elements 4200, 4300, 4500, and 4600 may be electrically connected to a bus 4400.

The flash memory device 4100 in FIG. 29 may operate substantially the same as a nonvolatile memory device in FIG. 1. That is, the flash memory device 4100 may be configured to program data with a selected memory unit (or, area or space) using a partial alternate programming (PA_PGM) manner. Thus, the flash memory device 4100 may provide the high integrity of data.

If the computing system 4000 is a mobile device, it may further include a battery 4700, which powers the computing system 4000. Although not shown in FIG. 29, the computing system 4000 may further include an application chipset, a camera image processor (CIS), a mobile DRAM, and the like. The memory controller 4200 and the flash memory device 4100 may constitute a solid state drive/disk (SSD), which uses a nonvolatile memory to store data.

A nonvolatile memory device or a memory controller may be packed by one selected from various types of packages such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method for programming a nonvolatile memory unit, the nonvolatile memory unit including multi-level memory cells associated with a plurality of word lines, the method comprising:

selecting, in an alternate order, the word lines to program first data at a first page portion and a second page portion associated with the selected word lines;

programming, according to the alternate order, the first data at the first and second page portions associated with the selected word lines;

selecting, in a sequential order, the word lines to program second data at a third page portion associated with the selected word lines; and programming, according to the sequential order, the second data at the third page portion associated with the selected word lines.

2. The method of claim 1, wherein selecting the word lines in the sequential order further comprises:

selecting the word lines one by one from a word line adjacent to a ground selection line.

3. The method of claim 1, wherein one of the first page portion and the third page portion corresponds to an LSB page portion of a multi-level memory cell.

4. The method of claim 1, wherein the nonvolatile memory unit includes a memory block, and wherein the memory block is an erase unit.

5. A method for programming a nonvolatile memory device, the nonvolatile memory device including multi-level memory cells associated with a plurality of word lines, the method comprising:

receiving first addresses in a first address sequence from a controller;

programming at least two page portions associated with selected first word lines from among the plurality of word lines according to the first address sequence;

receiving second addresses in a second address sequence from the controller; and programming another page portion associated with selected second word lines from among the plurality of word lines according to the second address sequence.

6. The method of claim 5, wherein the first address sequence includes a sequence in which at least one lower bit of at least one upper word line is programmed before at least one upper bit of at least one lower word line.

7. The method of claim 5, further comprising programming, according to the second address sequence, the another page portion after the at least two page portions are programmed according to the first address sequence.

8. The method of claim 5, further comprising programming, according to the second address sequence, the another page portion before the at least two page portions are programmed according to the first address sequence.

9. The method of claim 5, further comprising simultaneously programming data in at least two page portions associated with one of the plurality of word lines during a program operation using the second address sequence.

10. A method for programming a nonvolatile memory device, the nonvolatile memory device including multi-level memory cells connected to a plurality of rows and programmed by a page unit, the method comprising:

programming, in an alternate programming manner in which the rows are alternately selected, first data in at least two page portions of a selected memory unit; and programming, in a sequential programming manner in which the rows are selected according to an arrangement order, second data in at least another page portion of the selected memory unit.

11. The method of claim 10, wherein the at least another page portion includes an MSB page portion or an LSB page portion.

12. The method of claim 10, wherein the nonvolatile memory device includes a cell array having a plurality of cell strings formed in a direction perpendicular to a substrate.

13. The method of claim 10, wherein the selected memory unit corresponds to an erase unit of the nonvolatile memory device.

14. The method of claim 10, wherein the selected memory unit is formed of a plurality of cell strings selected by a string selection line.

15. The method of claim 10, wherein the nonvolatile memory device includes a plurality of memory chips; and wherein the selected memory unit corresponds to one of the plurality of memory chips.

16. The method of claim 10, wherein the nonvolatile memory device includes a plurality of memory devices connected to a plurality of channels; and wherein the selected memory unit corresponds to a channel unit or a super block unit corresponding to at least two memory blocks, and wherein the method further comprises:

simultaneously selecting the at least two memory blocks from different memory devices from among the plurality of memory devices by the plurality of channels.

17. A method for programming a nonvolatile memory device, the nonvolatile memory device including multi-level memory cells connected to a plurality of word lines and programmed by a page unit, the method comprising:

receiving a command to provide a programming mode to the nonvolatile memory device;

receiving write data synchronized at dual edges of a data strobe signal;

programming the write data at first and second page portions associated with selected word lines from among the plurality of word lines according to a first address sequence order based on the programming mode; and programming the write data at a third page portion associated with the selected word lines from among the plurality of word lines according to a second address sequence order based on the programming mode.

18. The method of claim 17, further comprising determining the first and second address sequences to program the write data based on the programming mode.

19. The method of claim 17, wherein the programming mode is associated with a partial alternate programming sequence.

* * * * *